(12) United States Patent
Chichibu et al.

(10) Patent No.: US 9,045,821 B2
(45) Date of Patent: Jun. 2, 2015

(54) LAMINATE, METHOD FOR PRODUCING SAME, AND FUNCTIONAL ELEMENT USING SAME

(75) Inventors: Shigefusa Chichibu, Miyagi (JP); Kouji Hazu, Miyagi (JP); Tokuyuki Nakayama, Chiba (JP); Akikazu Tanaka, Tokyo (JP)

(73) Assignees: Sumitomo Metal Mining Co., Ltd., Tokyo (JP); Tohoku University, Miyagi (JP)

( * ) Notice: Subject to any disclaimer, the term of this patent is extended or adjusted under 35 U.S.C. 154(b) by 4 days.

(21) Appl. No.: 13/582,571

(22) PCT Filed: Mar. 1, 2011

(86) PCT No.: PCT/JP2011/054659
§ 371 (c)(1),
(2), (4) Date: Sep. 4, 2012

(87) PCT Pub. No.: WO2011/108552
PCT Pub. Date: Sep. 9, 2011

(65) Prior Publication Data
US 2012/0325310 A1      Dec. 27, 2012

(30) Foreign Application Priority Data

Mar. 2, 2010   (JP) .................................. 2010-045920
Mar. 1, 2011   (JP) .................................. 2011-044497

(51) Int. Cl.
*H01L 31/042*   (2014.01)
*H01L 31/0687*  (2012.01)
(Continued)

(52) U.S. Cl.
CPC .............. *C23C 14/083* (2013.01); *C23C 14/086* (2013.01); *H01L 31/022466* (2013.01);
(Continued)

(58) Field of Classification Search
CPC ................. Y02E 10/50; H01L 31/042; H01L 31/022466; H01L 31/1884; C23C 14/024; C23C 14/0676; C23C 14/08; C23C 14/083; C23C 14/086; C23C 14/34
USPC .......... 136/255, 256, 246, 259; 428/640, 701; 257/99
See application file for complete search history.

(56) References Cited

U.S. PATENT DOCUMENTS 7,858,206 B2   12/2010   Furubayashi et al.
2003/0127051 A1   7/2003   Fritzemeier et al.
(Continued)

FOREIGN PATENT DOCUMENTS

JP   10-34798     2/1998
JP   10034798 A * 2/1998
(Continued)

OTHER PUBLICATIONS

Yoshitaka Nakanoa and Tetsu Kachi, Takashi Jimbo, "Characteristics of SiO2/n-GaN interfaces with b-Ga2O3 interlayers", Nov. 2003, Applied Physics Letters, vol. 83, No. 21, pp. 4336-4338.*
(Continued)

*Primary Examiner* — Jennifer Michener
*Assistant Examiner* — Mayla Gonzalez Ramos
(74) *Attorney, Agent, or Firm* — Gerald E. Hespos; Michael J. Porco; Matthew T. Hespos

(57) ABSTRACT

Provided is a laminate which includes a transparent conductive film layer that is composed of an oxide thin film mainly composed of titanium oxide and contains an additional element such as niobium, and also contains an anatase phase having more excellent crystallinity and further has high refractive index and low resistivity by forming an optimal buffer layer on the substrate. Also provided are: a semiconductor light emitting element which comprises the laminate; and a functional element such as a solar cell, which includes the laminate.

28 Claims, 4 Drawing Sheets

(51) Int. Cl.

| | |
|---|---|
| *H01L 31/0216* | (2014.01) |
| *H01L 31/0236* | (2006.01) |
| *H01L 31/054* | (2014.01) |
| *H01L 33/42* | (2010.01) |
| *B32B 15/00* | (2006.01) |
| *B32B 33/00* | (2006.01) |
| *C23C 14/08* | (2006.01) |
| *H01L 31/0224* | (2006.01) |
| *C23C 14/02* | (2006.01) |
| *C23C 14/06* | (2006.01) |
| *C23C 14/34* | (2006.01) |

(52) U.S. Cl.
CPC ............... *H01L33/42* (2013.01); *C23C 14/024* (2013.01); *C23C 14/0676* (2013.01); *C23C 14/08* (2013.01); *C23C 14/34* (2013.01)

(56) References Cited

U.S. PATENT DOCUMENTS

| | | | | |
|---|---|---|---|---|
| 2007/0184286 | A1* | 8/2007 | Nakayama et al. ........... | 428/432 |
| 2007/0287025 | A1* | 12/2007 | Furubayashi et al. ........ | 428/640 |
| 2008/0308833 | A1* | 12/2008 | Moriyama et al. .............. | 257/99 |
| 2010/0035082 | A1 | 2/2010 | Hitosugi et al. | |
| 2010/0261304 | A1* | 10/2010 | Chang et al. .................... | 438/72 |
| 2011/0011632 | A1 | 1/2011 | Nakao et al. | |
| 2012/0055534 | A1* | 3/2012 | Leschkies et al. ............ | 136/244 |

FOREIGN PATENT DOCUMENTS

| | | |
|---|---|---|
| JP | 2002-329669 | 11/2002 |
| JP | 2006/016608 | 2/2006 |
| JP | 2006/073189 | 7/2006 |
| JP | 2006-228754 | 8/2006 |
| JP | 2006228754 A * | 8/2006 |
| JP | 2006-324512 | 11/2006 |
| JP | 2007-210823 | 8/2007 |
| JP | 2008-50677 | 3/2008 |
| JP | 2008-84824 | 4/2008 |
| JP | 2008-294306 | 12/2008 |
| JP | 2009-231213 | 10/2009 |

OTHER PUBLICATIONS

Kouji Hazu, Aly Fouda, Tokuyuki Nakayama1, Akikazu Tanaka1, and Shigefusa F. Chichibu, "Crystal Phase-Selective Epitaxy of Rutile and Anatase Nb-Doped TiO2 Films on a GaN Template by the Helicon-Wave-Excited-Plasma Sputtering Epitaxy Method", Sep. 2010, Applied Physics Express 3.*

Taro Hitosugi et al.—"Heteroepitaxial Growth of Rutile TiO2 on GaN(0001) by Pulsed Laser Deposition"—Japanese Journal of Applied Physics, vol. 44, No. 50, 2005, pp. L 1503-L 1505.

Taro Hitosugi et al.—"Ta-doped Anatase TiO2 Epitaxial Film as Transparent Conducting Oxide"—Japanese Journal of Applied Physics, vol. 44, No. 34, 2005, pp. L 1063-L 1065.

Kouji Hazu et al.—"Crystal Phase-Selective Epitaxy of Rutile and Anatase Nb-Doped TiO2 Films on a GaN Template by the Helicon-Wave-Excited-Plasma Sputtering Epitaxy Method"—Applied Physics Express 3 (2010), pp. 091102-1-091102-3.

* cited by examiner

LAMINATE, METHOD FOR PRODUCING SAME, AND FUNCTIONAL ELEMENT USING SAME

BACKGROUND OF THE INVENTION

1. Field of the Invention

The present invention relates to a laminate and a method for producing the same, and a functional element using the same. More specifically, the present invention concerns a laminate and a method for producing such a laminate, the laminate being configured in such a manner that a buffer layer, which is composed of an oxide thin film made of such as gallium oxide or an oxynitride thin film made of such as gallium oxynitride, is once formed on a substrate, and on the buffer layer, a transparent conductive film, which is mainly composed of titanium oxide and containing niobium or the like, and also made of a crystalline material containing an anatase phase, and further has high refractive index and low specific resistivity, is formed. The present invention also relates to a functional element provided with the above laminate, and in particular to a semiconductor light emitting element and a solar cell.

2. Description of the Related Art

The transparent conductive film, which has a high conductivity and a high transmittance in a visible light range, is desirably used for a flat panel display, a solar cell, an electrode for various other light receiving elements, etc., and is also utilized as a heat ray reflective film for automobile windows and construction materials, an antistatic film and a transparent heat generating body for use in various kinds of anti-fogging purposes, such as freezer showcases, etc.

As the practical transparent conductive film, tin oxide ($SnO_2$)-based, zinc oxide (ZnO)-based and indium oxide ($In_2O_3$)-based thin films are proposed. Examples of the tin oxide-based thin films include those containing antimony as a dopant (ATO films) and those containing fluorine as a dopant (FTO films), and examples of the zinc oxide-based thin films include those containing aluminum as a dopant (AZO films) and those containing gallium as a dopant (GZO films), as well-known films. Now, indium oxide-based films have been most widely used as transparent conductive films in the industrial field. Among these, an indium oxide film containing tin as a dopant is referred to as an ITO (Indium-Tin-Oxide) film, and since the film makes it possible to easily provide a film having low resistivity, it has been widely utilized.

Moreover, most of transparent conductive films are made of semiconductors in which the n-type is degenerated. Therefore, electrons form the carrier, and the carrier concentration and mobility control the electric conductivity. In developments of the conventional transparent conductive film, attempts have been made to increase the carrier concentration in order to provide an ITO film having a lower resistivity.

The crystalline ITO film is made of an indium oxide phase in which tin is fused and solidified. This indium oxide phase forms a crystal structure referred to as "bixbyte" having a stable crystal phase of a cubic system under a normal pressure or a pressure lower than this. Therefore, the crystalline ITO film is allowed to generate a large number of carriers by oxygen deficiency as well as by replacing lattice points of trivalent indium in the bixbyte structure with tetravalent tin. Tin is an element that can increase the carrier concentration to the highest as a dopant, and it has been known that by adding 10% by weight of tin in tin oxide conversion, the lowest resistivity is achieved. The crystalline ITO film having its carrier concentration increased in this manner has remarkably superior characteristics, and has been used in various applications.

In recent years, there has been a fear of exhaustion of indium metal in the world, and its price has abruptly risen; consequently, developments of a transparent conductive film without using indium that can replace ITO films have been expected. Moreover, with current developments of various electronic devices, there have been strong demands for transparent conductive films that have a higher refractive index than the ITO film and exert a low electric resistivity equivalent to the ITO film.

As the application of such a transparent conductive film, typical examples thereof include a blue color LED and a solar cell. A gallium nitride layer is used as a light-emitting layer for the blue color LED, and one of optical characteristics of the gallium nitride layer is a high refractive index of about 2.4. On the other hand, in order to improve an extraction efficiency of light from the light-emitting layer, it is necessary to improve the matching characteristic of refractive indexes of the transparent conductive film and gallium nitride layer, and a refractive index close to 2.4 is required for the transparent conductive film.

The refractive index is a value inherent to each substance, and the refractive index of indium oxide generally known is as low as 1.9 to 2.0. Moreover, in the case when a gallium nitride layer is used for a light-emitting layer, a low surface resistivity is required for the transparent conductive film. The reason for this is because the gallium nitride layer has an electrical characteristic in that the current diffusion in a film surface direction is not sufficient. Here, in an attempt to lower the electric resistivity by increasing the carrier concentration of an indium oxide-based transparent conductive film, the refractive index is further lowered to 1.9 or less. In this manner, since the ITO film is a material whose carrier concentration is extremely increased by tin serving as a dopant, a problem arises in which in an attempt to obtain a crystal film with a low resistivity, its refractive index is lowered.

As the application in which characteristics superior to those of an ITO film are required for the transparent conductive film, a solar cell is listed as another example. Although the aforementioned FTO film is widely used for a surface electrode for the solar cell, solar light can be more effectively extracted by using a transparent conductive film having a higher refractive index. When used as one portion of the rear surface electrode, a transparent conductive film having an increased refractive index is sometimes used so as to improve the extraction efficiency for sun light and consequently to adjust the refractive index of the entire module, and in this case also, from the same reason as that for the blue color LED application, a transparent conductive film having a high refractive index is effectively used because the FTO film or the ITO film fails to provide a sufficient effect.

As the transparent conductive film having a refractive index higher than that of the ITO film, a transparent conductive film, which is prepared by adding a pentavalent or more element to titanium oxide having a refractive index higher than that of indium oxide, has been examined.

For example, Japanese Patent Application National Republication (Laid-Open) No. 2006-016608 has proposed a transparent metal material and a transparent electrode, which are formed by a material that is transparent and conducive, can be supplied stably, and is superior in chemical resistance. In this case, the description has proposed that by forming a metal oxide layer made of an anatase-type crystal structure, with the metal oxide layer being composed of M:$TiO_2$, a low resistivity is exerted while properly maintaining an inner transmittance, and that by forming M:TiO2 as a result of substitution of Ti sites of the anatase-type TiO2 with another atom (such as Nb, Ta, Mo, As, Sb, or W), the electric conductivity can be greatly improved, with transparency being properly maintained.

Moreover, Japanese Patent Application National Republication (Laid-Open) No. 2006-016608 has also proposed that a titanium oxide-based transparent conductive film is used for a transparent electrode for a blue LED. In particular, since the refractive index of an anatase-type TiO2 is about 2.4, this film is optimally used in an attempt to provide well-matched characteristics between refractive indexes of the blue LED and the gallium nitride layer. Japanese Patent Application National Republication (Laid-Open) No. 2006-016608 has described that after an alignment film, such as a ZnO film, a ZrO2 film, an SrTiO3 film, an MgO film, an LaAlO3 film, a CeO2 film, a ZrO2 film or an Al2O3 film, has been preliminarily formed on a substrate, a TiO2 film is formed thereon so that the alignment film functions as a buffer film (buffer layer). However, with respect to this description, since the expression "considered" is used, and since no examples are given to the alignment film, it doesn't leave the level of the supposition.

Japanese Patent Application Laid-Open No. 2008-50677 has proposed a metal oxide film made of a titanium dioxide film having an anatase structure in which one or two or more dopants selected from the group consisting of Sn, Hf, Si, Zr, Pb and Ge, and one or two or more dopants selected from the group consisting of Nb, Ta, Mo, As, Sb and W, are added to the titanium dioxide film, and the literature describes that by using this structure, while controlling a refractive index and a wavelength band forming a transmittance range by the concentration of the one or two or more dopants selected from the group consisting of Sn, Hf, Si, Zr, Pb and Ge, its resistivity is reduced by using the one or two or more dopants selected from the group consisting of Nb, Ta, Mo, As, Sb and W so that a metal oxide film having superior optical characteristics with a low resistivity can be obtained.

Moreover, Japanese Patent Application Laid-Open No. 2008-84824 has proposed a method for manufacturing a conductor characterized by including a step of forming on a substrate a precursor layer made of titanium oxide to which one or two or more dopants selected from the group consisting of Nb, Ta, Mo, As, Sb, Al, Hf, Si, Ge, Zr, W, Co, Fe, Cr, Sn, Ni, V, Mn, Tc, Re, P and Bi are added, and a step of forming a metal oxide layer by annealing the precursor layer under a reducing atmosphere, and the literature has described that by using this method, a conductor that has a good conductivity and is also superior in transparency can be obtained.

Furthermore, Japanese Patent Application Laid-Open No. 2009-231213 has proposed a conductor having a good conductivity and is superior in heat resistance and a method for manufacturing such a conductor, and described, in particular, that the conductor is characterized by a structure in which two or more layers, made of titanium oxide to which one or two or more dopants selected from the group consisting of Nb, Ta, Mo, As, Sb, W, N, F, S, Se, Te, Cr, Ni, Tc, Re, P and Bi are added, are formed on a substrate, with at least one layer of the two or more layers being a second layer in which a ratio of the number of atoms of the dopants relative to the total number of atoms of titanium and the dopants is set to 0.01 to 4% by atoms, and with a first layer having a more ratio of the number of atoms of dopants relative to the total number of atoms of titanium and the dopants than that of the second layer being formed between the second layer and the substrate.

However, with respect to Japanese Patent Application National Republication (Laid-Open) No. 2006-016608, Japanese Patent Application Laid-Open No. 2008-50677, Japanese Patent Application Laid-Open No. 2008-84824 and Japanese Patent Application Laid-Open No. 2009-231213, it has been known in general that it is difficult to directly form a titanium oxide thin film of an anatase structure onto a substrate. For example, it has been described that the direct formation is available only in the case of using a limited substrate, such as SrTiO3 or the like as described in Japanese Patent Application National Republication (Laid-Open) No. 2006-016608.

On the other hand, by utilizing a high refractive index of a titanium oxide-based transparent conductive film, the use thereof as a functional element, in particular, as a transparent electrode of a semiconductor light emitting element, has been examined.

For example, Japanese Patent Application National Republication (Laid-Open) No. 2006-073189 has proposed a functional element characterized by including AlxGayInzN (0≤x≤1, 0≤y≤1, 0≤z≤1), known as a light-emitting layer for blue LED, and an oxide material made of metal oxide formed on the AlxGayInzN, with the metal oxide being prepared as TiO2 or the like, and described that the resulting functional element has a structure in which a film that is less reflective on the interface, and compatibly has a good chemical resistance and durability, is integrally formed on a III group nitride having superior physical and chemical characteristics.

Moreover, Japanese Patent Application Laid-Open No. 2008-294306 has proposed a III group nitride-based compound semiconductor light emitting element in which a sapphire substrate, a buffer layer made of aluminum nitride (AlN), an n contact layer, an n clad layer, a multiple quantum well layer having a light emitting wavelength of 470 nm, a p clad layer and a p contact layer are formed, and a light transmitting electrode having irregularities made of titanium niobium oxide is formed on the n contact layer, with an electrode pad being formed on one portion of the electrode. The Japanese Patent Application Laid-Open No. 2008-294306 has described that, since the light transmitting electrode is formed by adding 3% of niobium to titanium oxide, the refractive index thereof to wavelength 470 nm is made virtually the same as that of the p contact layer, so that the total reflection on the interface between the p contact layer and the light transmitting electrode can be substantially avoided, with the light-extraction rate being improved by 30% by the irregularities.

However, although there is a description that a titanium oxide thin film to which niobium is added is epitaxially grown on gallium nitride in Japanese Patent Application National Republication (Laid-Open) No. 2006-073189 or Japanese Patent Application Laid-Open No. 2008-294306, there is no description indicating the fact that a titanium oxide thin film of an anatase structure is directly formed thereon. In contrast, as described in "Heteroepitaxial Growth of Rutile TiO2 on GaN (0001) by Pulsed Laser Deposition", Japanese Journal of Applied Physics, 2005, Vol. 44, p. L1503-L1505 by the inventors of Japanese Patent Application Laid-Open No. 2009-231213, the fact that on the gallium nitride, a titanium oxide thin film with niobium added thereto having not an anatase structure, but a rutile structure having a low conductivity is epitaxially grown has been reported.

In other words, to form a titanium oxide thin film with niobium added thereto having an anatase structure with a high conductivity on gallium nitride by an epitaxial growth or the like is still left as a subject to be achieved. Moreover, there have been strong demands for forming a titanium oxide thin film with niobium or the like added thereto having an anatase structure with a high conductivity on the outermost surface layer of a substrate, regardless of the crystal structure of the outermost surface layer of a functional element forming the substrate.

SUMMARY OF INVENTION

The object of the present invention is to provide a layer containing an anatase phase that is superior in crystallinity, with a high refractive index and a low specific resistivity, by forming an optimal buffer layer on a substrate, and for this purpose to also provide a laminate containing a transparent conductive film layer made of an oxide thin film, mainly made of titanium oxide containing an added element such as niobium, and a method for producing such a laminate.

Moreover, the present invention also provides a semiconductor light emitting element or a functional element such as a solar cell, provided with such a laminate. In particular, by making it possible to form a transparent conductive film containing an anatase phase that is superior in crystallinity, but is supposed to be difficult to be directly formed on gallium nitride serving as a light emitting layer for blue LED, the present invention provides a semiconductor light emitting element that is superior in light-extraction efficiency.

In order to solve the above problems, the inventors, etc. of the present invention have extensively studied to find that a buffer layer made of an oxide thin film such as a gallium oxide thin film or an oxynitride thin film such as gallium oxynitride, is once formed on a substrate, and by forming not directly on the substrate, but on the buffer layer, an oxide thin film, mainly made of titanium oxide, containing an added element such as niobium, the resulting oxide thin film exerts superior characteristics as a transparent conductive film; thus, the present invention has been completed.

That is, a first aspect of the present invention relates to a laminate characterized by a structure in which a buffer layer made of at least one or more kinds of oxide thin films, selected from the group consisting of a gallium oxide thin film, an oxide thin film made of gallium, indium and oxygen, and an oxide thin film made of gallium, indium, aluminum and oxygen, is formed on a substrate, and on the buffer layer, a transparent conductive film layer made of an oxide thin film, mainly composed of titanium oxide containing at least one or more kinds of elements selected from the group consisting of niobium, tantalum, molybdenum, arsenic, antimony and tungsten, is formed.

A second aspect of the present invention relates to a laminate in which the buffer layer of the first aspect is an oxynitride thin film made of at least one or more kinds of thin films selected from the group consisting of a gallium oxynitride thin film, an oxynitride thin film made of gallium, indium, oxygen and nitrogen, and an oxynitride thin film made of gallium, indium, aluminum, oxygen and nitrogen.

A third aspect of the present invention is characterized in that the transparent conductive film layer mainly composed of titanium oxide in accordance with the first and second aspects of the invention is a laminate containing an anatase phase, or a laminate consisting of an anatase phase, composed of only an anatase phase, composed of an anatase single phase, and in that the anatase single phase is grown by epitaxial growth with twelve-fold symmetry.

A fourth aspect of the present invention relates to a laminate in which the oxide thin film mainly composed of titanium oxide containing niobium, in accordance with the first to third aspects of the invention, has a niobium content represented by Nb/(Ti+Nb), having an atomic ratio in a range from 0.1 to 10% by atom, more preferably, from 2 to 6% by atom.

A fifth aspect of the present invention relates to a laminate in which the oxide thin film mainly composed of titanium oxide containing tantalum, in accordance with the first to third aspects of the invention, has a tantalum content represented by Ta/(Ti+Ta), having an atomic ratio in a range from 0.1 to 10% by atom, more preferably, from 3 to 7% by atom.

A sixth aspect of the present invention relates to a laminate in which the outermost surface layer of the substrate, in accordance with the first to fifth aspects of the invention, is a thin film layer selected from the group consisting of a gallium nitride layer, a gallium indium nitride layer and a gallium indium aluminum nitride layer.

A seventh aspect of the present invention relates to a laminate in which the buffer layer in accordance with the first and second aspects has a crystalline structure, and further has a crystal phase of a monoclinic-type β-Ga2O3 structure.

An eighth aspect of the present invention relates to a laminate in which the buffer layer in accordance with the first and second aspects has a thickness in a range from 0.1 to 50 nm, more preferably, from 0.1 to 1 nm.

A ninth aspect of the present invention relates to a method for producing a laminate having the steps of: forming a buffer layer made of at least one kind or more kinds selected from the group consisting of a gallium oxide thin film, an oxide thin film made of gallium, indium and oxygen and an oxide thin film made of gallium, indium, aluminum and oxygen, on a substrate; and on the buffer layer, forming an oxide thin film mainly composed of titanium oxide and containing at least one or more kinds of elements selected from the group consisting of niobium, tantalum, molybdenum, arsenic, antimony and tungsten, is formed, and this method is characterized in that at least the transparent conductive film is film-formed by using a helicon-wave excitation plasma sputtering method.

A tenth aspect of the present invention relates to the method for producing a laminate in which the buffer layer of the ninth aspect is an oxynitride thin film composed of at least one kind or more kinds selected from the group consisting of a gallium oxynitride thin film, an oxynitride thin film made of gallium, indium, oxygen and nitrogen, and an oxynitride thin film made of gallium, indium, aluminum, oxygen and nitrogen.

An eleventh aspect of the present invention relates to a functional element provided with any one of the laminates in accordance with the first to eighth aspects of the invention.

A twelfth aspect of the present invention relates to a semiconductor light emitting element in which at least an (Al1-x-y-zInxGayBz)N (0≤x1, 0≤y≤1, 0≤z≤1) layer serving as a light-emitting layer is formed on a substrate as an outermost surface layer, and the laminate in accordance with any one of the first to eighth aspects of the invention is formed on its (Al1-x-y-zInxGayBz)N layer.

A thirteenth aspect of the present invention relates to a solar cell in which the laminate in accordance with any one of the first to eighth aspects of the invention is formed on at least a photoelectric conversion layer.

In the laminate of the present invention, a buffer layer, which is composed of an oxide thin film made of gallium oxide or an oxynitride thin film made of gallium oxynitride, is once formed on a substrate so that a transparent conductive film layer made of an oxide thin film, which is mainly composed of titanium oxide and contains an additive element such as niobium or the like, to be formed on the buffer layer, is allowed to contain an anatase phase that is more superior in crystallinity; thus, it is possible to obtain effects of high refractive index and low specific resistivity.

In particular, on a gallium nitride layer serving as a blue LED light emitting layer, a thin film made of at least one or more kinds of oxide thin films, selected from the group consisting of a crystalline gallium oxide thin film having a monoclinic-type β-Ga2O3 structure, an oxide thin film composed of gallium, indium and oxygen and an oxide thin film composed of gallium, indium, aluminum and oxygen, is once formed as a buffer layer so that a transparent conductive film, made of an oxide thin film that is mainly composed of titanium oxide and contains an additive element such as niobium, is allowed to contain an anatase phase, and the anatase phase is epitaxially grown so as to exert, for example, twelve-fold symmetry, that is, so as to have the geometrically same face appeared each time a specific crystal face is rotated around an axis perpendicular to the face by 30°.

For example, FIG. 1 shows an epitaxial orientation relationship of twelve-fold symmetry on a (001) plane of an anatase phase on a (0001) plane of a gallium nitride layer. As shown in FIG. 1, the (001) plane of an anatase phase having a tetragonal system has 2 kinds of positions that are lattice matched with the (0001) plane of a gallium nitride layer having a hexagonal system, and these have a positional relationship with a shift of 30°. In other words, the (001) plane of the anatase phase is found to have an arrangement of twelve-fold symmetry on the (0001) plane of the gallium nitride layer.

As described above, matching of refractive index with the gallium nitride layer serving as a light emitting layer is obtained so that inner reflection of light on the interface between the gallium nitride layer and the transparent conductive film layer made of an oxide thin film that is mainly composed of titanium oxide and contains an additive element such as niobium can be prevented and the light-extraction coefficient can be improved.

Moreover, in the case when a transparent conductive film is used as one portion of a rear surface electrode of a solar cell, a conventional transparent conductive film has a problem in which the collection efficiency of solar light is low; however, by using the transparent conductive film having an improved refractive index of the present invention in place of the conventional transparent conductive film, a superior effect of improving the collection efficiency of solar light can be obtained.

DETAILED DESCRIPTION OF THE PREFERRED EMBODIMENTS

Figure 1:
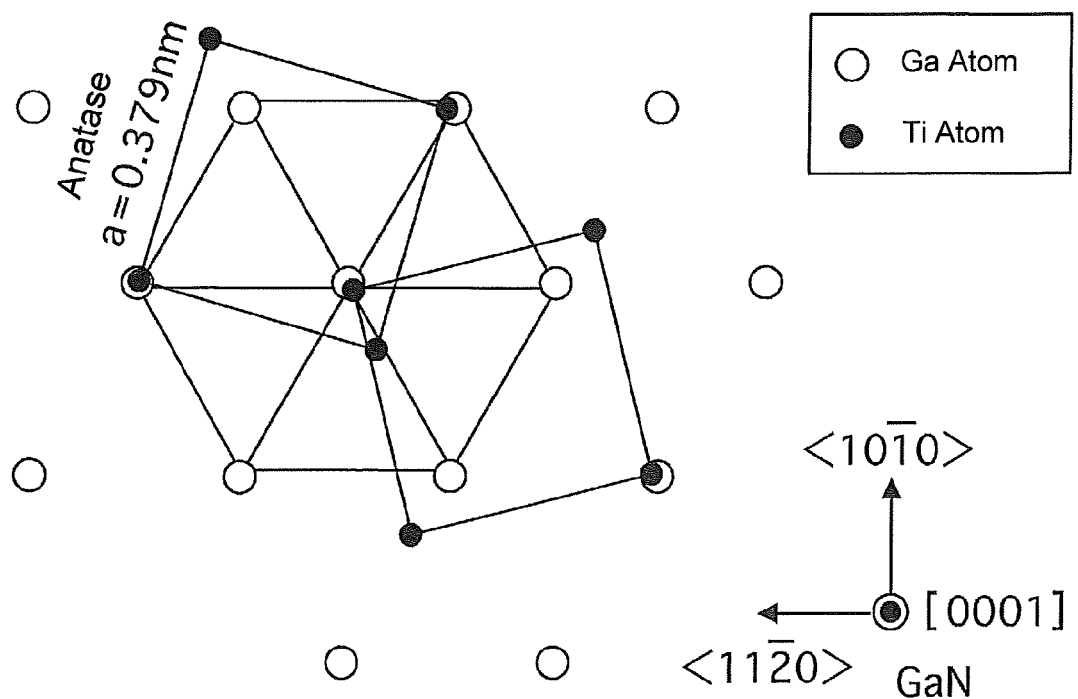
FIG. 1 is a drawing that shows an epitaxial orientation relationship of twelve-fold symmetry on a (001) plane of an anatase phase on a (0001) plane of a gallium nitride layer.

The following description will discuss a laminate of the present invention in detail.

[Laminate]
1. First Laminate

A first laminate of the present invention has a structure in which a buffer layer (hereinafter, referred to also as a first buffer layer) made of at least one or more kinds of oxide thin films, selected from the group consisting of a gallium oxide thin film, an oxide thin film made of gallium, indium and oxygen, and an oxide thin film made of gallium, indium, aluminum and oxygen, is formed on a substrate, and on the buffer layer, a transparent conductive film layer (hereinafter, referred to also as a transparent conductive film mainly composed of titanium oxide) made of an oxide thin film, mainly composed of titanium oxide, containing at least one or more kinds of elements selected from the group consisting of niobium, tantalum, molybdenum, arsenic, antimony and tungsten, is formed.

1-1. Transparent Conductive Film Mainly Composed of Titanium Oxide

In the first laminate of the present invention, the transparent conductive film, mainly composed of titanium oxide, preferably contains at least one or more kinds of elements selected from the group consisting of niobium, tantalum, molybdenum, arsenic, antimony and tungsten. By adding such additive elements to the titanium oxide film, an effect for improving the concentration of electrons forming carriers (hereinafter, referred to also as "carrier concentration") can be obtained.

In the above additive elements, in particular, niobium is preferable, and its content, represented by $Nb/(Ti+Nb)$ in atomic ratio, is preferably set in a range from 0.1 to 10% by atom, more preferably, from 2 to 6% by atom. In the case when the added amount of Nb is 0.1% by atom or less, the carrier concentration is not sufficiently increased, failing to provide a low specific resistivity, while in the case when the added amount exceeds 10% by atom, the mobility of electrons (hereinafter, sometimes referred to as "carrier mobility") forming carriers are not sufficiently increased, undesirably failing to provide a low specific resistivity.

Moreover, in addition to niobium, tantalum is also preferably used, and its content, represented by $Ta/(Ti+Ta)$ in atomic ratio, is preferably set in a range from 0.1 to 10% by atom, more preferably, from 3 to 7% by atom. In the case when the added amount of Ta is 0.1% by atom or less, the carrier concentration is not sufficiently increased in the same manner as in Nb, failing to provide a low specific resistivity, while in the case when the added amount exceeds 10% by atom, the carrier mobility is not sufficiently increased, undesirably failing to provide a low specific resistivity.

The transparent conductive film mainly composed of titanium oxide preferably contains an anatase phase, and is more preferably prepared as a crystalline material consisting of an anatase phase, composed of only an anatase phase or composed of an anatase single phase in order to obtain a lower specific resistivity. The anatase phase has a tetragonal crystal structure, and when its microscopic structure is viewed, it is constituted by a $TiO_6$ octahedron structure. When attention is focused on the $TiO_6$ octahedron structure, since the anatase structure has four ridges of a tetrahedron shared with another tetrahedron, the distance between Ti atoms becomes shorter; therefore, it is considered that this fact is advantageous for providing a good electric conductivity. In fact, it has been reported that the effective mass of electrons of the anatase phase is about 1 $m_0$ ($m_0$ corresponds to mass of free electrons in vacuum), which is comparatively small. In general, the effective mass of electrons represents apparent mass of electrons, and as the effective mass becomes small, electrons are more easily transferred within a crystal of the transparent conductive film, thereby making the conductivity higher. The effective mass of the ITO film is reported as being 0.3 to 0.35 $m_0$, and since the anatase phase has a small value equivalent to the value of the ITO film, it is considered to satisfy the above-mentioned idea.

1-2. First Buffer Layer

As the first buffer layer, a thin film made of at least one kind or more kinds of thin films selected from the group is used:
(a) a gallium oxide thin film,
(b) an oxide thin film composed of gallium, indium and oxygen, and
(c) an oxide thin film composed of gallium, indium, aluminum and oxygen.

The first buffer layer is preferably selected to be prepared as an amorphous material or a crystalline material depending on the kinds of its substrate. However, in the case when the outermost surface layer of the substrate is a gallium nitride layer and an attempt is made to provide an oxide thin film mainly composed of titanium oxide as an anatase phase having high crystallinity on the gallium nitride layer, the first buffer layer is preferably made of a crystalline material.

Moreover, the first buffer layer, formed on the gallium nitride layer, is preferably made of a crystalline material having a monoclinic-type $\beta$-$Ga_2O_3$ structure. In this case, since a transparent conductive film mainly composed of titanium oxide, formed on the first buffer layer, is allowed to form an epitaxial thin film containing an anatase phase having a twelve-fold symmetry structure, this structure is preferably used for this effect.

1-3. Method for Producing First Buffer Layer and Transparent Conductive Film Layer Mainly Composed of Titanium Oxide The first buffer layer and the transparent conductive film layer mainly composed of titanium oxide, which form the first laminate of the present invention, can be formed by using various film-forming methods that are conventionally known techniques.

More specifically, these layers are formed by using physical film-forming methods such as a sputtering method, an ion plating method, a PLD (Pulse Laser Deposition) method described in Japanese Patent Application National Republication (Laid-Open) No. 2006-073189 or a cluster ion beam method, or chemical film-forming methods, such as a CVD (Chemical Vapor Deposition) method, a spraying method, a sol-gel method or an MOD (Metal Organic Decomposition) method.

Among these, from an industrial viewpoint, as a method for forming the first laminate of the present invention, in particular, the sputtering method and the ion plating method are preferably used. The PLD method described in Japanese Patent Application National Republication (Laid-Open) No. 2006-073189 is disadvantageous to a large-area film-forming process.

With respect to the sputtering method, more specifically, a DC sputtering method, a DC pulse sputtering method or a high-frequency sputtering method is proposed, and the helicon-wave excitation plasma sputtering method, described in Japanese Patent Application Laid-Open No. 2002-329669, is preferably used because this method is a film-forming method capable of forming a thin film that is superior in crystallinity.

Upon forming the first buffer layer, as its target, a sintered-material target of gallium oxide, an oxide composed of gallium and indium or an oxide composed of gallium, indium and aluminum, is preferably used, and in particular, an oxide sintered-material target having an increased conductivity, obtained by carrying out a reducing treatment or a sintering process or the like by a hot pressing method, is preferably used. Since metal gallium has a low melting point of about 30° C., it is difficult to use the material, as it is, as a target; however, in the case of a metal target made of metal composed of gallium and indium and a metal target made of metal composed of gallium, indium and aluminum, these are sometimes applicable, since these are allowed to have a high melting point, depending on the compositions thereof.

As a target to be used for film-forming a transparent conductive film layer mainly composed of titanium oxide by using a sputtering method, a metal target mainly composed of titanium containing at least one or more kinds of elements selected from the group consisting of niobium, tantalum, molybdenum, arsenic, antimony and tungsten, or an oxide sintered-material target obtained by mixing and sintering an oxide of the above-mentioned metal elements can be used. However, upon using the above metal target, a problem arises in that as the film-forming process proceeds by sputtering, an oxide coat film having a low conductivity is formed on the target surface to cause a reduction in the film-forming rate. Therefore, the oxide sintered-material target is more preferably used. In particular, the oxide sintered-material target having an increased conductivity, obtained by carrying out a reducing treatment or a sintering process or the like by a hot pressing method, is preferably used.

In the case when the first buffer layer or the transparent conductive film layer mainly composed of titanium oxide, which forms the first laminate of the present invention by using various sputtering methods, a mixed gas between an inert gas and oxygen, in particular, between argon and oxygen, is preferably used as a sputtering gas. Moreover, the film-forming process is preferably carried out by setting a sputtering gas pressure inside the chamber of the sputtering device in a pressure range from 0.1 to 5 Pa, more preferably, from 0.1 to 1.0 Pa.

In the case of forming the transparent conductive film layer mainly composed of titanium oxide by using a sputtering method, an optimal oxygen partial pressure in the sputtering gas is narrow, for example, in comparison with a transparent conductive film of another kind, such as an ITO film, although it is different depending on specifications of the device.

In the case of using the helicon-wave excitation plasma sputtering method described in Japanese Patent Application Laid-Open No. 2002-329669, it is preferably set in a range from $2.5 \times 10^{-5}$ Pa to $5.0 \times 10^{-3}$ Pa. Under a pressure out of this pressure range, the transparent conductive film mainly composed of titanium oxide is sometimes formed not as an anatase phase, but as a rutile phase. Additionally, in the case of using a glass substrate, the oxygen partial pressure is preferably set in a range from $2.5 \times 10^{-5}$ Pa to $5.0 \times 10^{-4}$ Pa.

In the present invention, after having been vacuum-evacuated, for example, to $2 \times 10^{-4}$ Pa or less, a mixed gas composed of argon and oxygen is introduced so that a gas pressure is set to 0.1 to 5.0 Pa, and power is applied so that power relative to an area of the target, that is, a power density, is set to a range from about 1 to 3 W/cm$^2$ so as to generate a plasma; thus, a pre-sputtering process can be carried out. It is preferable to carry out this pre-sputtering process for 5 to 30 minutes, and after a discharge state has been stabilized, to carry out a sputtering film-formation after the substrate position has been revised, if necessary.

In the present invention, by carrying out a film formation with the substrate being heated to a predetermined temperature, it becomes possible to obtain a crystalline film in which each of the layers has a desired structure. In this case, the substrate temperature is preferably set in a range from 300° C. or more to 1000° C. or less, more preferably, from 450° C. or more to 650° C. or less. When the substrate temperature is lower than 300° C., it is difficult to form a crystalline material, and when the substrate temperature exceeds 1000° C., this state is not desirable since, for example, upon forming a layer on gallium nitride, the gallium nitride is thermally damaged.

Moreover, an amorphous film is formed at a low temperature near room temperature, and thereafter, this film may be formed into a crystal film by carrying out a heating treatment thereon. The temperature of the heating treatment is preferably set in a range from 300° C. or more to 1000° C. or less, more preferably, from 450° C. or more to 650° C. or less. When the heating treatment temperature is lower than 300° C., it is difficult to form a crystalline material, and when the temperature exceeds 1000° C., this state is not desirable since, for example, upon forming a layer on gallium nitride, the gallium nitride is thermally damaged. The thermal treatment atmosphere is preferably prepared as a non-oxidative atmosphere, and from the industrial viewpoint, the atmosphere is more preferably prepared as a vacuum atmosphere or a nitrogen atmosphere.

Moreover, in the case when the outermost surface layer of the substrate is a thin film layer selected from the group consisting of a gallium nitride layer, a gallium indium nitride layer and a gallium indium aluminum nitride layer, the first buffer layer may be formed by a thermal oxidizing method, that is, by a process in which the substrate itself is subjected to a heating treatment in an atmosphere containing oxygen. As a pretreatment for this thermal oxidation, an oxidizing treatment for the purpose of removing a natural oxide film is effectively carried out. As one example for this oxidizing treatment, a treatment method including the following sequences (1) to (4) is proposed:

(1) a washing treatment by using acetone, ethanol, or the like;

(2) an immersing treatment in high-purity hydrochloric acid, aqua regia, or hydrofluoric acid for a predetermined period of time;

(3) a washing treatment with ultrapure water in an exclusively-used vessel; and (4) an ultrasonic wave washing treatment with ultrapure water in an exclusively-used vessel.

As conditions for the thermal oxidation, a temperature range is preferably set to 300° C. or more to 1000° C. or less, more preferably, to 450° C. or more to 950° C. or less. When the temperature at the time of the thermal oxidization is lower than 300° C., a crystalline material is hardly formed, and when the temperature exceeds 1000° C., this state is undesirable because, for example, upon forming a layer on gallium nitride, the gallium nitride is thermally damaged. As the oxygen partial pressure, although not particularly limited, it is preferably set to $1.0 \times 10^5$ Pa or less from the industrial viewpoint.

The thickness of the first buffer layer is not particularly limited as long as a transparent conductive film layer mainly composed of titanium oxide is formed as an anatase phase having superior crystallinity; however, from the industrial viewpoint, the film thickness is preferably set in a range from 0.1 nm to 50 nm. In this case, however, upon forming the layer on a gallium nitride layer serving as a light-emitting layer of a semiconductor light emitting element, the thickness is preferably set in a range from 0.1 nm to 5 nm, more preferably, from 0.1 nm to 2 nm, in order to avoid the layer from forming an electric resistance layer with the transparent conductive film layer forming an electrode.

In particular, upon forming a transparent conductive film mainly composed of titanium oxide on gallium nitride, in the case when the film thickness of the first buffer layer is in a range from 0.1 nm to 1 nm, in a bandwidth chart of a laminate having a hetero structure, the Fermi level is locally lowered in such a manner as to drop with a spike shape relative to the conductive band on the gallium nitride layer side just in the vicinity of the interface of an anatase-phase TiO2 thin film/ (first buffer layer/) gallium nitride layer that are hetero-joined to each other. In this state, it is specified that a two-dimensional electron gas is accumulated in such a drop portion to cause a phenomenon in which electrons are moving at high speeds.

By this phenomenon, a peculiarly high carrier mobility is realized, with the result that a specific resistivity at room temperature of $4 \times 10^{-4}$ Ω·cm or less and a carrier mobility of 200 $cm^2V^{-1}s^{-1}$ or more are exerted. In the case of the thickness of the first buffer layer of 0.1 nm or less, the transparent conductive film mainly composed of titanium oxide forms not an anatase phase, but a rutile phase, and in contrast, in the case of the thickness exceeding 1 nm, since the above-mentioned bandwidth chart is not formed, such a phenomenon in which electrons are moving at high speeds is not exerted. Additionally, such a phenomenon in which peculiarly high-speed electrons are moving makes it possible to eliminate a defect in that current diffusion of a p-type gallium nitride layer toward its film surface direction is low.

2. Second Laminate

A second laminate of the present invention is characterized by a structure in which a buffer layer (hereinafter, referred to also as a second buffer layer) made of at least one or more kinds of oxynitride thin films, selected from the group consisting of a gallium oxynitride thin film, an oxynitride thin film made of gallium, indium, oxygen and nitrogen, and an oxynitride thin film made of gallium, indium, aluminum, oxygen and nitrogen, is formed on a substrate, and on the buffer layer, a transparent conductive film layer mainly composed of titanium oxide that is the same as that of the first laminate is formed.

2-1. Second Buffer Layer

The second buffer layer is different from the first buffer layer in that in contrast to the first buffer layer made of an oxide, the second buffer layer is made of an oxynitride. As the second buffer layer, a thin film made of at least one kind or more kinds of thin films selected from the following group is used:

(d) a gallium oxynitride thin film, (e) an oxynitride thin film composed of gallium, indium, oxygen and nitrogen, (f) an oxynitride thin film composed of gallium, indium, aluminum, oxygen and nitrogen.

The second buffer layer is preferably selected to be prepared as an amorphous material or a crystalline material depending on the kinds of its substrate. However, in the case when an attempt is made to form a transparent conductive film made of an oxide thin film mainly composed of titanium oxide containing an anatase phase having a high crystallinity on the gallium nitride layer, the second buffer layer is preferably made of a crystalline material.

Moreover, in the case when the second buffer layer, formed on the gallium nitride layer, is made of a crystalline material having a β-Ga$_2$O$_3$ structure, since a transparent conductive film mainly composed of titanium oxide, formed on the second buffer layer, is allowed to form an epitaxial thin film containing an anatase phase having a twelve-fold symmetry structure, this structure is preferably used for this effect.

A preferable film thickness of this second buffer layer, determined in the same manner as in the first buffer layer, is preferably set in a range from 0.1 nm to 50 nm, more preferably, from 0.1 nm to 5 nm, most preferably, from 0.1 nm to 2 nm. Moreover, in the same manner as in the first buffer layer, in order to realize a phenomenon in which electrons are moving at high speeds on the gallium nitride layer side just in the vicinity of the interface of an anatase-phase TiO2 thin film/(second buffer layer/) gallium nitride layer that are hetero-joined to each other, the film thickness of the second buffer layer is desirably set in a range from 0.1 nm to 1 nm.

2-2. Method for Producing Second Buffer Layer

The second buffer layer can be formed by using various film-forming methods that are the same as those used for forming the first buffer layer and the transparent conductive film layer mainly composed of titanium oxide.

Upon forming the second buffer layer, as its target, a sintered-material target of gallium oxide, an oxide composed of gallium, indium and oxygen, an oxide composed of gallium, indium, aluminum and oxygen, or a gallium oxynitride, an oxynitride composed of gallium, indium, oxygen and nitrogen, and an oxynitride composed of gallium, indium, aluminum, oxygen and nitrogen, is preferably used, and in particular, a sintered-material target having an increased conductivity, obtained by carrying out a reducing treatment or a sintering process or the like by a hot pressing method, is preferably used. Since metal gallium has a low melting point of about 30° C., it is difficult to use the material, as it is, as a target; however, in the case of an alloy target made of an alloy composed of gallium and indium or an alloy composed of gallium, indium and aluminum, these are sometimes applicable, since these are allowed to have a higher melting point than that of metal gallium, depending on the compositions thereof.

The method for forming the second buffer layer is carried out by using basically the same producing method as that of the first buffer layer. However, in the case when various sputtering methods are used for forming the layer, as a sputtering gas, oxygen, or nitrogen, or both of oxygen and nitrogen are used as an inert gas, or in particular, a mixed gas using argon as an inert gas is preferably used. Ratios of components of the sputtering gas can be selected in accordance with a target to be used. The same is true for the ion plating method or the PLD method.

Moreover, in the case when the substrate is made of gallium nitride, gallium indium nitride, or gallium indium aluminum nitride, the second buffer layer may be formed by a thermal oxidizing method in the same manner as in the first buffer layer. As conditions for the thermal oxidation, a temperature range is preferably set to 500° C. or less, more preferably, to 10° C. or more to 300° C. or less. The oxygen partial pressure is preferably set from $1.0 \times 10^{-4}$ Pa or more to $1.0 \times 10^5$ Pa or less, more preferably, from $1.0 \times 10^{-3}$ Pa or more to $3.0 \times 10^4$ Pa or less.

[Functional Element]

A functional element of the present invention is characterized by including each of the laminates of the present invention. That is, a first laminate forming one of them is a laminate characterized by a structure in which a buffer layer made of at least one or more kinds of oxide thin films, selected from the group consisting of a gallium oxide thin film, an oxide thin film made of gallium, indium and oxygen, and an oxide thin film made of gallium, indium, aluminum and oxygen, is formed on a substrate, and on the buffer layer, a transparent conductive film layer made of an oxide thin film, mainly composed of titanium oxide, containing at least one or more kinds of elements selected from the group consisting of niobium, tantalum, molybdenum, arsenic, antimony and tungsten, is formed.

Alternatively, a second laminate is characterized by a structure in which a buffer layer is an oxynitride thin film made of at least one or more kinds of oxynitride thin films, selected from the group consisting of a gallium oxynitride thin film, an oxynitride thin film made of gallium, indium, oxygen and nitrogen, and an oxynitride thin film made of gallium, indium, aluminum, oxygen and nitrogen.

The functional element is provided with such a laminate, and utilizes the transparent conductive film layer mainly composed of titanium oxide used in the laminate as a transparent electrode, and since the transparent conductive film layer is included therein, the functional element makes it possible to exert superior characteristics that have not conventionally known.

As the typical functional element, a semiconductor light emitting element and a solar cell are listed. In addition to these, the functional element also includes, for example, a liquid crystal panel, a plasma display, an organic EL, an inorganic EL or an electronic paper.

3. Semiconductor Light Emitting Element

The semiconductor light emitting element of the present invention is a semiconductor light emitting element having a structure in which at least (Al1-x-y-zInxGayBz)N ($0 \leq x \leq 1$, $0 \leq y \leq 1$, $0 \leq z \leq 1$) layer serving as a light-emitting layer is formed as an outermost surface layer of a substrate, and on this (Al$_{1-x-y-z}$In$_x$Ga$_y$B$_z$)N layer, the first or second buffer layer is once formed, and on this buffer layer, a transparent conductive film mainly composed of titanium oxide is formed.

Moreover, the present invention is widely applied to known semiconductor light emitting elements having a structure in which a transparent conductive film is formed on at least the (Al1-x-y-zInxGayBz)N ($0 \leq x \leq 1$, $0 \leq y \leq 1$, $0 \leq z \leq 1$) layer serving as a light-emitting layer.

Figure 2:
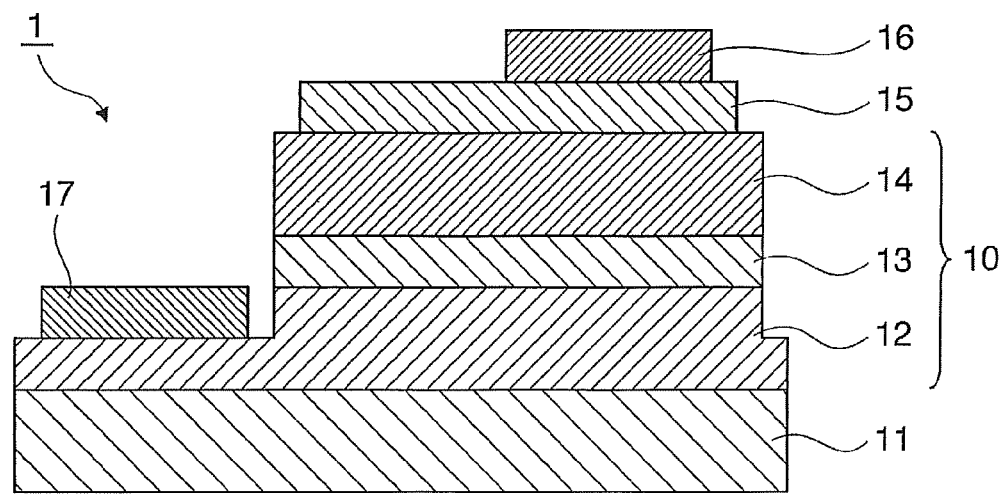
FIG. 2 is a cross-sectional view schematically showing one example of a semiconductor light emitting element of the present invention.

In order to help to improve understanding of the present invention, referring to FIG. 2, the following description will briefly discuss a general structure of a semiconductor light emitting element to which the present invention is applied.

3-1. Compound Semiconductor Layer

For example, the following description will discuss a structure of a gallium nitride-based compound semiconductor layer of a semiconductor light emitting element and a method for manufacturing the same.

For example, in a face-up-type structure, a gallium nitride-based compound semiconductor layer 10 is formed by successively stacking an n-type GaN layer 12, a light emitting layer 13 and a p-type GaN layer 14 on a substrate (see FIG. 2). More specifically, the gallium nitride-based compound semiconductor layer 10 is constructed by successively stacking on a substrate 11, a buffer layer (not shown) made of AlN, a GaN base layer (not shown), an n-type GaN contact layer (not shown), an n-type GaN layer 12 made of an n-type AlGaN clad layer (not shown), a light-emitting layer 13 made of InGaN, a p-type AlGaN clad layer (not shown) and a p-type GaN layer 14 made of a p-type GaN contact layer (not shown). In this case, as the gallium nitride-based compound semiconductor layer, those having various structures have been known, and those conventionally known layers may be used without any limitations.

As the p-type semiconductor layer 14, for example, those having a general carrier concentration may be used, and even in the case when a p-type GaN layer having a comparatively low carrier concentration, for example, about $1\times10^{17}$ cm$^{-3}$, is used, on this p-type semiconductor layer 14, the first or second buffer layers and the laminate 15 mainly composed of titanium oxide serving as the transparent electrode (positive electrode), which form the present invention, may be applied. Moreover, as the p-type semiconductor layer 14, those subjected to an irregularity-forming treatment so as to have a geometrically improved light-extraction efficiency are more preferably used.

As the gallium nitride-based compound semiconductor 10, those semiconductors having various compositions represented by the above-mentioned general formula $(Al_{1-x-y-z}In_xGa_yB_z)N$ ($0 \leq x \leq 1$, $0 \leq y \leq 1$, $0 \leq z \leq 1$) are preferably used, and as the compound semiconductor layer of the present invention, various semiconductors having these compositions may be used without any limitations.

With respect to the growing method of these gallium nitride-based compound semiconductors, not particularly limited, any of those methods known as being capable of growing III group nitride semiconductors, such as MOCVD (Metal Organic Chemical Vapor Deposition), MOVPE (Metal Organic Vapor Phase Epitaxy), HVPE (Hydride Vapor Phase Epitaxy) and MBE (Molecular Beam Epitaxy), may be used. As the epitaxy method, from the viewpoints of various controlling characteristics and productivity, the MOVPE method is preferable.

The present invention is not intended to be limited by the above-exemplified gallium nitride-based compound semiconductor layer, and it is needless to say that it can be applicable to gallium nitride-based compound semiconductor layers having modified structures on demand.

3-2. Substrate

In the semiconductor light emitting element of the present invention, as the substrate 11, those known substrate materials, for example, oxide single crystals, such as sapphire single crystal ($Al_2O_3$; A plane, C plane, M plane, R plane), spinel single crystal ($MgAl_2O_4$), ZnO single crystal, $LiAlO_2$ single crystal, $LiGaO_2$ single crystal and MgO single crystal, as well as Si single crystal, SiC single crystal, GaAs single crystal, AlN single crystal, GaN single crystal, and boride single crystals, such as $ZrB_2$ or the like, may be used without any limitations.

In this case, the plane orientation of the substrate 11 is not particularly limited. Moreover, as the substrate 11, those just substrates or those substrates to which an off-angle is applied may be used.

3-3. Negative Electrode

After the formation of the laminate of the present invention, that is, after the first or second buffer layer and the laminate layer 15 made of a transparent electrode film mainly composed of titanium oxide have been formed, or after the formation and annealing treatment of the laminate 15, by removing, for example, portions of the p-type semiconductor layer 14, the light-emitting layer 13 and the n-type semiconductor layer 12 by the use of etching, the n-type semiconductor layer 12 is exposed, and a negative electrode 17 is formed on the exposed n-type semiconductor layer 12 (see FIG. 2). As the negative electrode 17, those having various compositions and structures, such as, for example, those made of Ti/Au, have been known, and those known negative electrodes can be used without any limitations.

3-4. Positive Electrode Bonding Pad

Positive electrode bonding pads 16 for use in electrical connection to circuit substrates or lead frames are formed on some portions of the first or second buffer layer and the laminate body 15 mainly composed of titanium oxide serving as positive electrodes. As the positive electrode bonding pad, those having various structures using materials, such as Au, Al, Ni and Cu, have been known, and those pads having known materials and structures can be used without any limitations. Moreover, the thickness of the positive electrode bonding pad is preferably set in a range from 100 to 1000 nm. Furthermore, with respect to the characteristics of the bonding pad, since its bondability becomes higher as its thickness becomes greater, the thickness of the positive electrode bonding pad is more preferably set to 300 nm or more. Moreover, from the viewpoint of production costs, it is preferably set to 500 nm or less.

3-5. Protective Layer

In order to prevent oxidation of the transparent electrode (positive electrode) made of the laminate 15 of the present invention, a protective layer (not shown) is preferably formed in a manner so as to cover the entire area of the transparent conductive film except for the areas on which the positive electrode bonding pads 16 are formed.

This protective layer is preferably formed by using a material having a superior light transmitting characteristic, and is more preferably formed by using a material having an insulating characteristic in order to prevent leakage between the p-type semiconductor layer 14 and the n-type semiconductor layer 12. Therefore, as the material for forming the protective layer, for example, $SiO_2$, $Al_2O_3$ and the like are preferably used. Moreover, the film thickness of the protective layer can be set to any value as long as the oxidation of the transparent conductive film can be prevented, with a superior light transmitting characteristic being provided, and more specifically, the film thickness is for example set in a range from 2 nm to 500 nm.

4. Lamp Using Semiconductor Light Emitting Element

The semiconductor light emitting element of the present invention may be assembled into a lamp with a transparent cover attached thereto, for example, by using means known by the person skilled in the art. Moreover, by combining the semiconductor light emitting element of the present invention and a cover having a phosphor material, a white color lamp may be formed.

The semiconductor light emitting element of the present invention may be assembled into an LED lamp by using a conventionally known method, without any limitations. The lamp may be applied to any usages, such as a generally-use shell type, a side view type for use in a backlight for a cellular phone and a top-view type for use in a display device.

5. Solar cell

A solar cell of the present invention has a structure in which at least a photoelectric conversion layer is formed, and a first or second buffer layer is once formed on the photoelectric conversion layer, with a transparent conductive film mainly composed of titanium oxide being formed on the buffer layer. The present invention can be widely applied to those conventionally known semiconductor light emitting elements having a structure in which at least a transparent conductive film is formed on a photoelectric conversion layer. As the photoelectric conversion layer, those which are formed by a compound semiconductor-based material, such as a polycrystal or single crystal Si-based material, a thin-film Si-based material, a CIGS-based material, or a CdTe or GaAs material, etc., or a tandem structure of these materials are taken into consideration.

EXAMPLES

The following description will discuss the present invention in detail by means of examples; however, the present invention is not intended to be limited by these examples.

[Evaluation of Basic Characteristics of Transparent Conductive Film]

The composition of a resulting transparent conductive film is examined by using an XPS device (ESCALAB200i-Xl, made by VS Scientific, Ltd.) or an ICP light emission spectrometry.

The film thickness of the transparent conductive film was measured by using a surface roughness meter (Alpha-Step IQ: made by Tencol Co., Ltd.). The film-forming rate was calculated by the film thickness and the film-forming time.

The surface resistivity of the film was measured by using a four-point probe method by means of Van der Pauw method, by the use of a resistivity meter (Loresta EP MCP-T360 type: Dia Instrument Co., Ltd.).

The specific resistivity of the film was calculated by the product of the surface resistivity of the film and the film thickness.

The refractive index of the film was measured by a spectroscopic ellipsometer (FE-5000UV, made by Otsuka Electronics Co., Ltd.)

The generation phase and crystallinity of the film were identified by $2\theta/\theta$ measurements and $\phi$ scanning carried out by an X-ray diffraction device (D8, made by Bruker Co., Ltd.).

In particular, the film thickness of the buffer layer was measured by a film-thickness monitor attached to a helicon-wave excitation plasma sputtering device, and confirmed by observations using a TES-EDS (HF-2200, NORAN VANTAGE, made by Hitachi High-Technologies Corporation).

Moreover, the bandwidth chart of the laminate was specified by using an XPS device (QuanteraSXM, made by PHI Co., Ltd.).

Example 1

On a glass substrate, a buffer layer made of a gallium oxide thin film was formed, and a transparent conductive film layer, mainly composed of titanium oxide, containing niobium was formed thereon. In each of the film forming processes, a helicon-wave excitation plasma sputtering device (made by Sanyu Electron Co., Ltd.) was used.

As the glass substrate, an AN 100 substrate made by Asahi Glass Co., Ltd., with a thickness of 1.1 mm, was used. As the target, a gallium oxide sintered-material target having a diameter of 50 mm and a thickness of 6 mm and a niobium-added titanium oxide sintered-material target (made by Sumitomo Metal Mining Co., Ltd.) were used. Here, the content of niobium was 5.7% by atom in atomic ratio represented by Nb/(Ti+Nb).

First, a gallium oxide thin film was formed.

The inside of a chamber in a sputtering device was evacuated to a vacuum degree of $5\times10^{-3}$ Pa or less, and this state was maintained, and after having been confirmed that the substrate temperature had reached 500° C., an argon gas was introduced thereto and the gas pressure was adjusted to 0.5 Pa. The distance between the target and the substrate was fixed to 35 mm. Next, a high-frequency power of 300 W was applied to generate a helicon-wave excitation plasma, and after carrying out a pre-sputtering process for 30 minutes or more, with a target bias of −300 V being applied thereto, the target was re-arranged in a direction in which the substrate and the film-formation center position were coincident with each other, and a film-forming process was carried out.

Successively, a transparent conductive film mainly composed of titanium oxide containing niobium was formed. The film-forming processes were carried out in the same manner as those of the gallium oxide thin film except that a mixed gas of argon and oxygen was introduced as a sputtering gas so as to have an oxygen ratio of 0.1%, with the gas pressure being adjusted to 0.5 Pa. Additionally, it was preliminarily confirmed that at this oxygen ratio of 0.1%, the transparent conductive film has the lowest specific resistivity.

By appropriately controlling the film-forming time, a gallium oxide thin film having a film thickness of 10 nm was formed on the glass substrate, and on the thin film, a laminate film made of a transparent conductive film mainly composed of titanium oxide containing niobium, with a film thickness of 200 nm, was formed. In this case, the compositions of the resulting gallium oxide thin film and transparent conductive film were confirmed to be the same as the respective targets.

Figure 3:
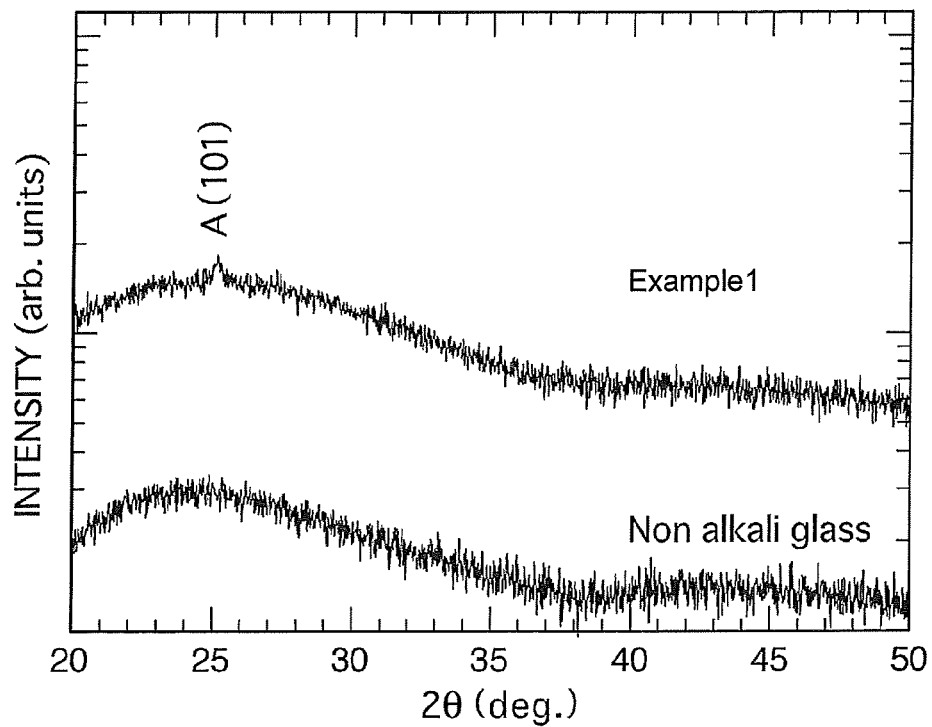
FIG. 3 is an X-ray diffraction graph showing crystallinity of a transparent conductive film in accordance with example 1.

The resulting transparent conductive film had a specific resistivity of $4.2\times10^{-4}$ $\Omega\cdot cm$ and a refractive index of 2.5 at a wavelength of 460 nm. As a result of measurements on the crystallinity of the film by X-ray diffraction measuring method, as shown in FIG. 3, the film was confirmed to be a crystalline film made of only an anatase phase. Additionally, since no diffraction peaks were confirmed with respect to the gallium oxide thin film, the film was estimated as being made of an amorphous material.

Example 2

The same processes as those of example 1 were carried out except that the buffer layer was changed to an oxide thin film composed of gallium, indium and oxygen so that a laminate film was formed.

As the target, an oxide sintered-material target, composed of gallium, indium and oxygen, having a diameter of 50 mm and a thickness of 6 mm (made by Sumitomo Metal Mining Co., Ltd.) was used. Here, the content of indium of this target was 5% by atom in atomic ratio represented by In/(Ga+In).

The resulting transparent conductive film had a specific resistivity of $4.5\times10^{-4}$ $\Omega\cdot cm$ and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1. Additionally, since no diffraction peaks were confirmed with respect to the gallium oxide thin film, the film was estimated as being made of an amorphous material.

Example 3

The same processes as those of example 1 were carried out except that the buffer layer was changed to an oxide thin film composed of gallium, indium, aluminum and oxygen so that a laminate film was formed.

As the target, an oxide sintered-material target, composed of gallium, indium, aluminum and oxygen, having a diameter of 50 mm and a thickness of 6 mm (made by Sumitomo Metal Mining Co., Ltd.) was used. Here, the content of indium of this target was 5% by atom in atomic ratio represented by In/(Ga+In+Al), and the content of aluminum was 1% by atom in atomic ratio represented by Al/(Ga+In+Al).

The resulting transparent conductive film had a specific resistivity of $5.4\times10^{-4}$ $\Omega\cdot cm$ and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1. Additionally, since no diffraction peaks were confirmed with respect to the gallium oxide thin film, the film was estimated as being made of an amorphous material.

Example 4

The same processes as those of example 1 were carried out except that the buffer layer was changed to an gallium oxynitride thin film so that a laminate film was formed.

Upon forming the gallium oxynitride thin film, a gallium nitride sintered-material target having a diameter of 50 mm and a thickness of 6 mm (made by Sumitomo Metal Mining Co., Ltd.) was used. Film-forming processes were carried out under the same conditions as those of the gallium oxide thin film of example 1, except that a mixed gas of argon and oxygen was used as the sputtering gas, and that the oxygen ratio was changed to 0.02% and the gas pressure was changed to 0.5 Pa.

The resulting transparent conductive film had a specific resistivity of $4.4 \times 10^{-4}$ Ω·cm and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1. Additionally, since no diffraction peaks were confirmed with respect to the gallium oxynitride thin film, the film was estimated as being made of an amorphous material.

Example 5

The same processes as those of example 1 were carried out except that the niobium content of a niobium-added titanium oxide sintered-material target (made by Sumitomo Metal Mining Co., Ltd.) was changed to 9.3% by atom in atomic ratio represented by Nb/(Ti+Nb) so that a laminate film was formed.

The resulting transparent conductive film had a specific resistivity of $5.3 \times 10^{-4}$ Ω·cm and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1. Additionally, since no diffraction peaks were confirmed with respect to the gallium oxide thin film, the film was estimated as being made of an amorphous material.

Example 6

The same processes as those of example 1 were carried out except that a titanium oxide sintered-material target (made by Sumitomo Metal Mining Co., Ltd.) to which tantalum was added in place of niobium was used and that the content of tantalum was changed to 5.0% by atom in atomic ratio represented by Ta/(Ti+Ta) so that a laminate film was formed.

The resulting transparent conductive film had a specific resistivity of $5.1 \times 10^{-4}$ Ω·cm and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1. Additionally, since no diffraction peaks were confirmed with respect to the gallium oxide thin film, the film was estimated as being made of an amorphous material.

Example 7

The surface of a GaN substrate (hereinafter, referred to also as "GaN template") prepared by growing a GaN film with a thickness of about 3 μm, whose substrate surface corresponds to a (0001) plane, on a sapphire substrate by an MOVPE method, was subjected to an acid treatment so that a natural oxide film was removed. Next, a thermal oxidizing treatment was carried out thereon in an electric furnace under an oxygen atmosphere of $1.0 \times 10^5$ Pa at 900° C. so that a buffer layer made of a gallium oxide thin film was formed. The thickness of the gallium oxide thin film was 2 nm. Thereafter, the same processes as those of example 1 were carried out; thus, a transparent conductive film layer mainly composed of titanium oxide containing niobium was formed thereon so that a laminate film was formed.

The resulting transparent conductive film had a specific resistivity of $3.9 \times 10^{-4}$ Ω·cm and a refractive index of 2.5 at a wavelength of 460 nm, which were virtually the same level as that of example 1.

As a result of measurements on the crystallinity of the film by X-ray diffraction measuring method, the film was confirmed to be a crystalline film made of only an anatase phase as in the case of example 1.

Figure 4:
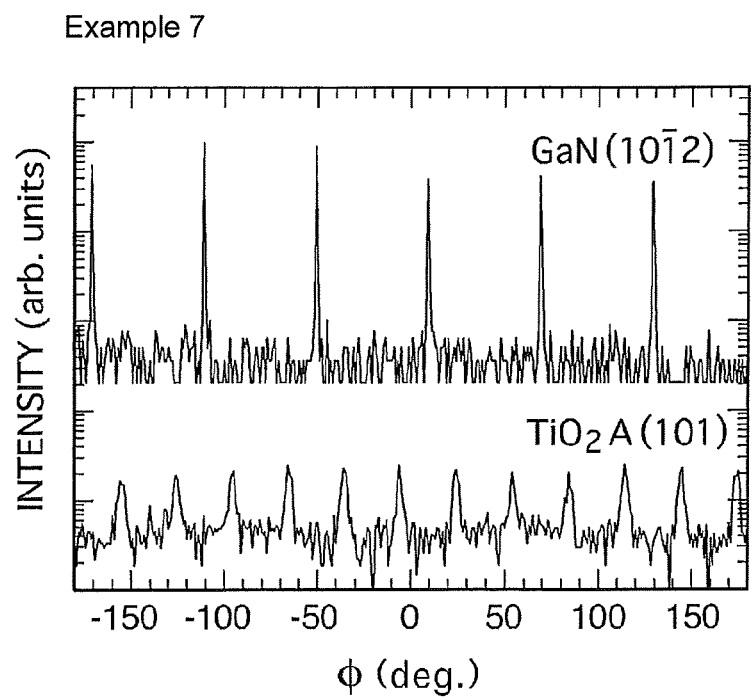
FIG. 4 is a drawing that shows results of (101) in-plane orientation measurements of an anatase phase by φ scanning of the transparent conductive film of example 7.

FIG. 4 is a drawing that shows results of orientation measurements by φ scanning. As a result of examinations on the diffraction of (101) plane of the anatase phase, it was clearly shown that an anatase phase (peak indicated by TiO2 A(101)) on the gallium nitride layer was grown with an epitaxial orientation relationship of twelve-fold symmetry. With respect to the gallium oxide thin film, no diffraction peak was confirmed because its film thickness was extremely thin; however, as a result of TEM observations, it was confirmed that the film was made of not an amorphous material, but a crystalline material, and had a $\beta$-$Ga_2O_3$ structure.

Additionally, as a result of hole measurements, the carrier mobility was less than 200 $cm^2V^{-1}s^{-1}$, and a phenomenon in which the mobility of electrons serving as carriers becomes peculiarly high was not observed.

Example 8

The same processes as those of example 7 were carried out except that with respect to film-forming conditions of a transparent conductive film mainly composed of titanium oxide containing niobium, the oxygen ratio in a sputtering gas composed of a mixed gas of argon and oxygen was changed to 0.02% and that the gas pressure thereof was changed to 5 Pa so that a laminate film was formed on a GaN template.

Figure 5:
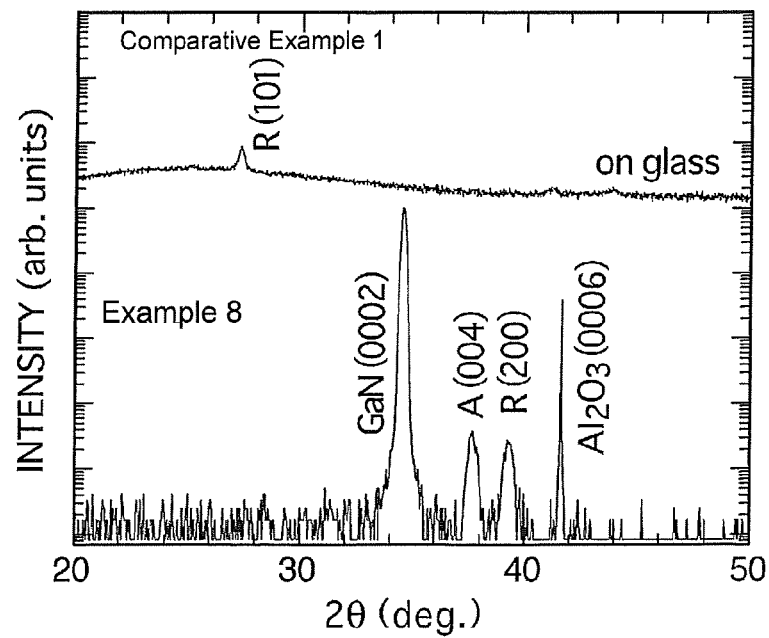
FIG. 5 is an X-ray diffraction graph showing crystallinity of a transparent conductive film in accordance with example 8 and comparative example 1.

As a result of measurements on the crystallinity of the transparent conductive film by X-ray diffraction measuring method, as shown in FIG. 5, it was confirmed that the film was a crystalline film made of an anatase phase and a rutile phase, and that the respective phases were grown respectively with an epitaxial orientation relationship of twelve-fold symmetry and an epitaxial orientation relationship of six-fold symmetry, relative to the gallium nitride layer. The gallium oxide thin film was confirmed to be made of a crystalline material in the same manner as in example 7.

When the in-plane orientation was examined by θ scanning, it was confirmed that not only the anatase phase on the gallium nitride layer was grown with an epitaxial orientation relationship of twelve-fold symmetry, but also the rutile phase was grown with an epitaxial orientation relationship of six-fold symmetry. In this case, however, the intensity of the rutile phase was confirmed to be weaker in comparison with the anatase phase. That is, actually, the anatase phase was confirmed to be a main phase.

Additionally, the laminate had a specific resistivity of $4.3 \times 10^{-4}$ Ω·cm and a refractive index of 2.6 at a wavelength of 460 nm. Moreover, as a result of hole measurements, the carrier mobility was less than 200 cm$^2$V$^{-1}$s$^{-1}$, and a phenomenon in which the mobility of electrons serving as carriers becomes peculiarly high was not observed.

Example 9

A transparent conductive film mainly composed of titanium oxide containing niobium and a buffer layer made of a gallium oxide thin film were formed by respectively using a helicon-wave excitation plasma sputtering method, under film-forming conditions of an oxygen ratio of 0.02% in a sputtering gas composed of a mixed gas of argon and oxygen, with a gas pressure being set to 5 Pa, so that a laminate film was formed on a GaN template. The film thicknesses of the transparent conductive film mainly composed of titanium oxide containing niobium and the gallium oxide thus formed were 200 nm and 0.6 nm, respectively.

Figure 6:
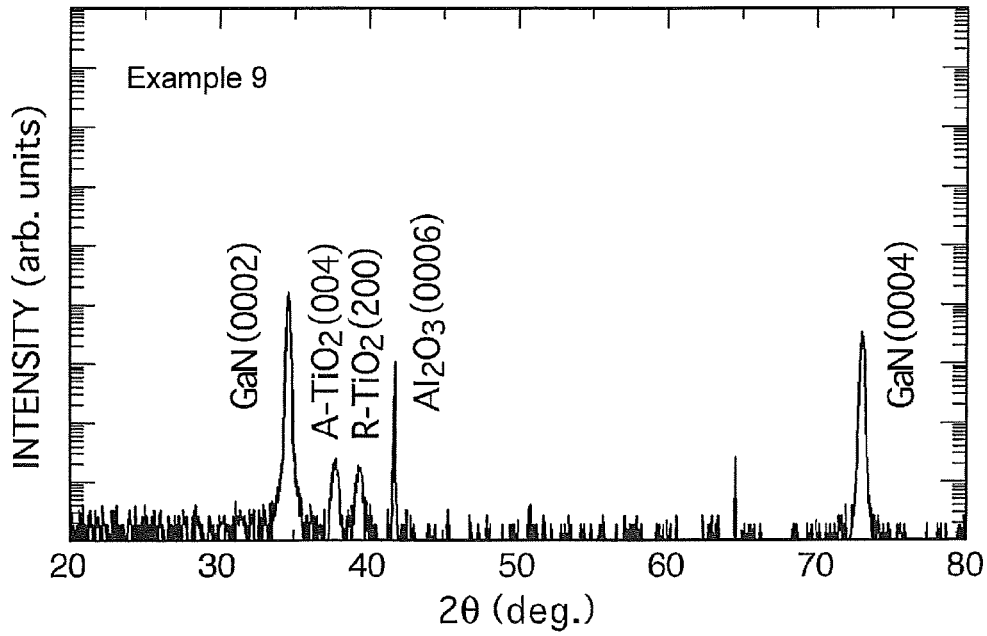
FIG. 6 is an X-ray diffraction graph showing crystallinity of a transparent conductive film in accordance with example 9.

As a result of measurements on the crystallinity of the transparent conductive film by X-ray diffraction measuring method, as shown in FIG. 6, it was confirmed that the film was a crystalline film made of an anatase phase and a rutile phase, and that the respective phases were grown respectively with an epitaxial orientation relationship of twelve-fold symmetry and an epitaxial orientation relationship of six-fold symmetry, relative to the gallium nitride layer. The gallium oxide thin film was confirmed to be made of a crystalline material in the same manner as in example 7.

Figure 7:
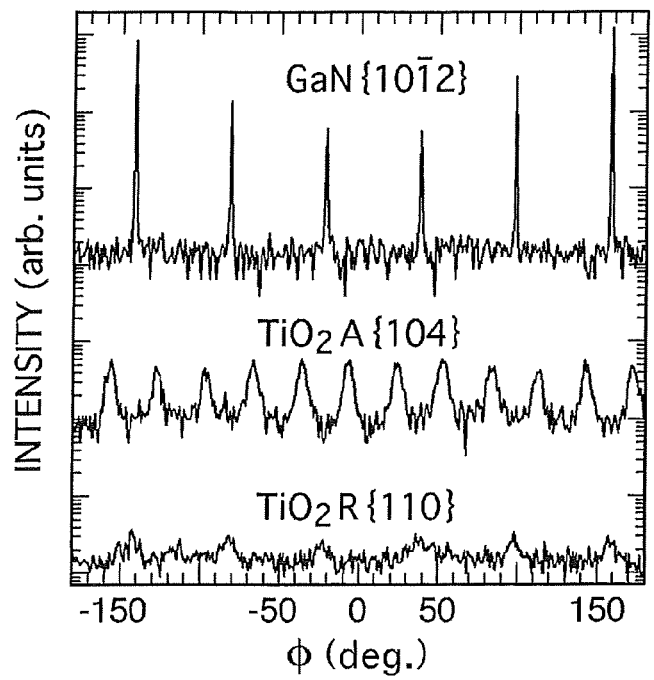
FIG. 7 is a drawing that shows results of (104) in-plane orientation measurements of an anatase phase by φ scanning of the transparent conductive film of example 9.

FIG. 7 shows the results of examinations on the in-plane orientation by the use of θ scanning.

As a result of examinations on the diffraction of a (104) plane of the anatase phase, it was clearly confirmed that the anatase phase (peak indicated by A-TiO$_2$\{104\}) on the gallium nitride layer was grown with an epitaxial orientation relationship of twelve-fold symmetry. In contrast, the rutile phase (peak indicated by R—TiO$_2$\{110\}) on the gallium nitride layer was grown with an epitaxial orientation relationship of six-fold symmetry; however, when taken into consideration that the axis of ordinates was indicated by a Log scale, it was found that its intensity was weak in comparison with the anatase phase. That is, actually, the anatase phase was confirmed to be a main phase.

When the refractive index of the transparent conductive film mainly composed of titanium oxide containing niobium was measured by using a spectroscopic ellipsometer, the film had a refractive index of 2.6 at a wavelength of 460 nm.

Next, hole measurements were carried out on this laminate having a hetero structure. As a result, the laminate had a specific resistivity of $3.6 \times 10^{-4}$ Ω·cm and at this time, also had a carrier mobility of 260 cm$^2$V$^{-2}$s$^{-2}$, which was 200 cm$^2$V$^{-2}$s$^{-1}$ or more, so that it was clarified that the mobility of electrons serving as carriers was peculiarly high.

Since it was estimated that this peculiarly high carrier mobility was derived from the hetero structure, the bandwidth chart was examined by XPS measurement (X-ray Photoelectron Spectrometry) measurement. As a result, it was found that the Fermi level was locally lowered in such a manner as to drop with a spike shape relative to the conductive band on the gallium nitride layer side just in the vicinity of the interface of an anatase-phase TiO2 thin film/(gallium oxide thin film/) gallium nitride layer that are hetero-joined to each other, and it was specified that in this drop portion, a two-dimensional electron gas was accumulated to cause a phenomenon in which electrons were moving at high speeds. The peculiarly high carrier mobility was considered to be realized by this phenomenon.

Example 10

After carrying out an acid treatment on the surface of a GaN template to remove a natural oxide film therefrom, a buffer layer made of a gallium oxide thin film was formed thereon by a helicon-wave excitation plasma sputtering method in the same manner as in example 9 while controlling its film thickness so as to correspond to a layer with several atoms. The film thickness was 0.1 nm. Thereafter, by carrying out the same processes as those of example 9, a transparent conductive film layer mainly composed of titanium oxide containing niobium was formed thereon by the same sputtering method; thus, a laminate film was formed.

Examinations on the resulting transparent conductive film showed that the same electric characteristics and optical characteristics as those of example 9 were obtained, and in particular, with respect to the electric characteristics, a phenomenon in which electrons move at high speeds, derived from the hetero structure, was confirmed. That is, as a result of hole measurements, the carrier mobility was 200 cm$^2$V$^{-2}$s$^{-2}$ or more. It was confirmed that the film structure had an anatase phase with the same epitaxial orientation relationship as that of example 9. By carrying out measurements by φ scanning, it was confirmed that the main phase was an anatase phase with a small amount of a rutile phase contained therein, which was the same as example 9. Moreover, as a result of TEM observations, it was confirmed that the buffer layer was not an amorphous material, but a crystalline material, and had a β-Ga$_2$O$_3$ structure.

Comparative Example 1

The same processes as those of example 1 were carried out except that a transparent conductive film mainly composed of titanium oxide containing niobium was directly formed on a glass substrate, and that with respect to film-forming conditions, the oxygen ratio in a sputtering gas composed of a mixed gas of argon and oxygen was changed to 0.02%, with a gas pressure being changed to 5 Pa, so that a laminate film was formed.

The resulting transparent conductive film had a specific resistivity of $2.1 \times 10^{-2}$ Ω·cm, which was higher than that of example 1. The refractive index at a wavelength of 460 nm was 2.6.

As a result of examinations on the film crystallinity by X-ray diffraction measurements, it was confirmed that as shown in FIG. 5, the film was a crystalline film composed of only the rutile phase, which was different from the result of example 1.

Comparative Example 2

After carrying out an acid treatment on the surface of a GaN template to remove a natural oxide film therefrom, a transparent conductive film layer mainly composed of titanium oxide containing niobium was directly formed thereon by using the same processes as those of example 7 so that a laminate film was formed.

As a result of examinations on the crystallinity of the transparent conductive film by X-ray diffraction measurements, it was confirmed that the film was a crystalline film composed of the rutile phase, and the rutile phase on the gallium nitride layer was grown with an epitaxial orientation relationship of six-fold symmetry.

This laminate had a specific resistivity of $4.5 \times 10^{-2}$ Ω·cm and a refractive index of 2.6 at a wavelength of 460 nm. Moreover, as a result of hole measurements, the carrier mobility was less than 200 $cm^2V^{-1}s^{-1}$, and a phenomenon in which the mobility of electrons serving as carriers becomes peculiarly high was not observed.

Example 11

A semiconductor light emitting element was manufactured by the following processes.
[Production of Gallium Nitride-Based Compound Semiconductor Layer]

On a substrate composed of c-plane ((0001) crystal plane) of sapphire, a light emitting layer having a multiple quantum well structure, composed of an undoped GaN base layer (layer thickness: 2000 nm), an Si doped n-type GaN contact layer (layer thickness: 2000 nm, carrier concentration=$1 \times 10^{19}$ $cm^{-3}$), an Si doped n-type $Al_{0.07}Ga_{0.93}N$ clad layer (layer thickness: 12.5 nm, carrier concentration=$1 \times 10^{18}$ $cm^{-3}$), six-layered Si doped GaN barrier layers (layer thickness: 14.0 nm, carrier concentration=$1 \times 10^{18}$ $cm^{-3}$) and five-layered undoped s-type $In_{0.20}Ga_{0.80}N$ well layers (layer thickness: 2.5 nm), as well as an Mg doped p-type $Al_{0.07}Ga_{0.93}N$ clad layer (layer thickness: 10 nm) and an Mg doped p-type GaN contact layer (layer thickness: 100 nm), were successively stacked with a buffer layer made of AlN interpolated therebetween. In this case, the respective constituent layers of the laminate structural body of the above-mentioned gallium nitride-based compound semiconductor layer were grown by an MOVPE method.
[Production of Semiconductor Light Emitting Element]

Next, by using the resulting gallium nitride-based compound semiconductor layer, a gallium nitride-based compound semiconductor light emitting element was produced. First, by using HF and HCl, the surface of the p-type GaN contact layer of the gallium nitride-based compound semiconductor layer was washed, and by carrying out the same processes as those of example 7 except that the temperature of the thermal oxidizing treatment was changed to 500° C., a buffer layer composed of gallium oxide and next a laminate film mainly composed of titanium oxide containing niobium were successively formed, on the p-type GaN contact layer, with its film thickness being adjusted to 220 nm.

Thereafter, the laminate film was patterned by dry etching to be formed into a structure in which the laminate film was formed only on the positive electrode forming region on the p-type GaN contact layer.

Next, by carrying out dry etching on the n-type electrode forming region, the surface of the Si doped n-type GaN contact layer was exposed, only within the region. Thereafter, by using a vacuum vapor-deposition method, on one portion of the laminated film layer (positive electrode) as well as on the Si doped n-type GaN contact layer, a first layer composed of Cr (layer thickness: 40 nm), a second layer composed of Ti (layer thickness: 100 nm) and a third layer composed of Au (layer thickness: 400 nm) were successively stacked so that a positive electrode bonding pad and a negative electrode were respectively formed. After the positive bonding pad and the negative electrode had been formed, the rear surface of the substrate made of sapphire was polished by using abrasive grain such as diamond fine grain to be finally finished into a mirror surface. Thereafter, the laminate structural body was cut and separated into individual chips, each having a square shape with 350 μm in each side; thus, a semiconductor light emitting element was obtained.
[Measurements of Light Emitting Wavelength and Light Emitting Output]

The semiconductor light emitting element (chip) thus obtained was mounted on a lead frame, and connected to the lead frame with a gold (Au) wire. Then, a current was applied thereto through a probe needle, and the light emitting wavelength and the light emitting output were measured by using a general-use integrating sphere.

With respect to the light emission distribution of the light emitting surface, light emission was exerted on the entire surface of the positive electrode, and it was confirmed that a light emitting wavelength was located in a wavelength range near 460 nm. Moreover, it was confirmed that the light emission efficiency was improved by 15% in comparison with the application of an ITO film as the positive electrode.

Example 12

In the same manner as in example 9 except that the film thickness of a gallium oxide thin film serving as a buffer layer was changed to 0.3 nm, after carrying out an acid treatment on the surface of a GaN template to remove a natural oxide film therefrom, a buffer layer made of a gallium oxide thin film was formed thereon by a helicon-wave excitation plasma sputtering method, and a transparent conductive film layer mainly composed of titanium oxide containing niobium was successively formed thereon; thus, a laminate film was formed.

Examinations on the resulting transparent conductive film showed that the same electric characteristics and optical characteristics as those of example 9 were obtained, and in particular, with respect to the electric characteristics, a phenomenon in which electrons move at high speeds derived from the hetero structure was confirmed. That is, as a result of hole measurements, the carrier mobility was 200 $cm^2V^{-1}s^{-1}$ or more. It was confirmed that the film structure had an anatase phase with the same epitaxial orientation relationship as that of example 9.

By carrying out measurements by ϕ scanning, it was confirmed that the main phase was an anatase phase with a small amount of a rutile phase contained therein, which was the same as example 9. Moreover, as a result of TEM observations, it was confirmed that the buffer layer was not an amorphous material, but a crystalline material, and had a $\beta$-$Ga_2O_3$ structure.

Example 13

In the same manner as in example 9 except that the film thickness of a gallium oxide thin film serving as a buffer layer was changed to 1 nm, after carrying out an acid treatment on the surface of a GaN template to remove a natural oxide film therefrom, a buffer layer made of a gallium oxide thin film was formed thereon by a helicon-wave excitation plasma sputtering method, and a transparent conductive film layer mainly composed of titanium oxide containing niobium was successively formed thereon; thus, a laminate film was formed.

Examinations on the resulting transparent conductive film showed that the same electric characteristics and optical characteristics as those of example 9 were obtained, and in particular, with respect to the electric characteristics, a phenomenon in which electrons move at high speeds derived from the hetero structure was confirmed. That is, as a result of hole measurements, the carrier mobility was 200 cm$^2$V$^{-2}$s$^{-2}$ or more.

It was also confirmed that the film structure had an anatase phase with the same epitaxial orientation relationship as that of example 9. By carrying out measurements by φ scanning, it was confirmed that the main phase was an anatase phase with a small amount of a rutile phase contained therein, which was the same as example 9. Moreover, as a result of TEM observations, it was confirmed that the buffer layer was not an amorphous material, but a crystalline material, and had a β-Ga$_2$O$_3$ structure.

Example 14

In the same manner as in example 9 except that the film thickness of a gallium oxide thin film serving as a buffer layer was changed to 2 nm, after carrying out an acid treatment on the surface of a GaN template to remove a natural oxide film therefrom, a buffer layer made of a gallium oxide thin film was formed thereon by a helicon-wave excitation plasma sputtering method, and a transparent conductive film layer mainly composed of titanium oxide containing niobium was successively formed thereon; thus, a laminate film was formed.

As a result of measurements on the crystallinity of the transparent conductive film by X-ray diffraction measuring method, it was confirmed that the film was a crystalline film made of an anatase phase and a rutile phase, and that the respective phases were grown respectively with an epitaxial orientation relationship of twelve-fold symmetry and an epitaxial orientation relationship of six-fold symmetry, relative to the gallium nitride layer. The gallium oxide thin film was confirmed to be made of a crystalline material in the same manner as in example 7.

When the in-plane orientation was examined by 0 scanning, it was found that based upon the diffraction of a (104) plane of the anatase phase, the anatase phase (A-TiO$_2$\{104\}) on the gallium nitride layer was grown with an epitaxial orientation relationship of twelve-fold symmetry, and that the rutile phase (R—TiO$_2$\{110\}) was grown with an epitaxial orientation relationship of six-fold symmetry. In this case, however, when taken into consideration that the axis of ordinates was indicated by a Log scale, it was found that its intensity was weak in comparison with the anatase phase. That is, actually, the anatase phase was confirmed to be a main phase.

When the refractive index of the transparent conductive film mainly composed of titanium oxide containing niobium was measured by using a spectroscopic ellipsometer, the film had a refractive index of 2.6 at a wavelength of 460 nm.

Next, the specific resistivity of the laminate was measured, and value of 4.2×10$^{-4}$ Ω·cm was obtained. However, as a result of hole measurements, its carrier mobility was less than 200 cm$^2$V$^{-1}$s$^{-1}$ so that a phenomenon in which the mobility of electrons serving as carriers becomes peculiarly high was not observed.

Example 15

In the same manner as in example 9 except that in place of the gallium oxide thin film, an oxide thin film composed of gallium, indium and oxygen, having a film thickness of 0.6 nm was used, after carrying out an acid treatment on the surface of a GaN template to remove a natural oxide film therefrom, a buffer layer of an oxide thin film composed of gallium, indium and oxygen was formed thereon by a helicon-wave excitation plasma sputtering method, and a transparent conductive film layer mainly composed of titanium oxide containing niobium was successively formed thereon; thus, a laminate film was formed. Additionally, in the composition of the oxide thin film composed of gallium, indium and oxygen, the indium content was 50% by atom in atomic ratio represented by In/(Ga+In) so that it was confirmed that a target composition had been reproduced.

Figure 8:
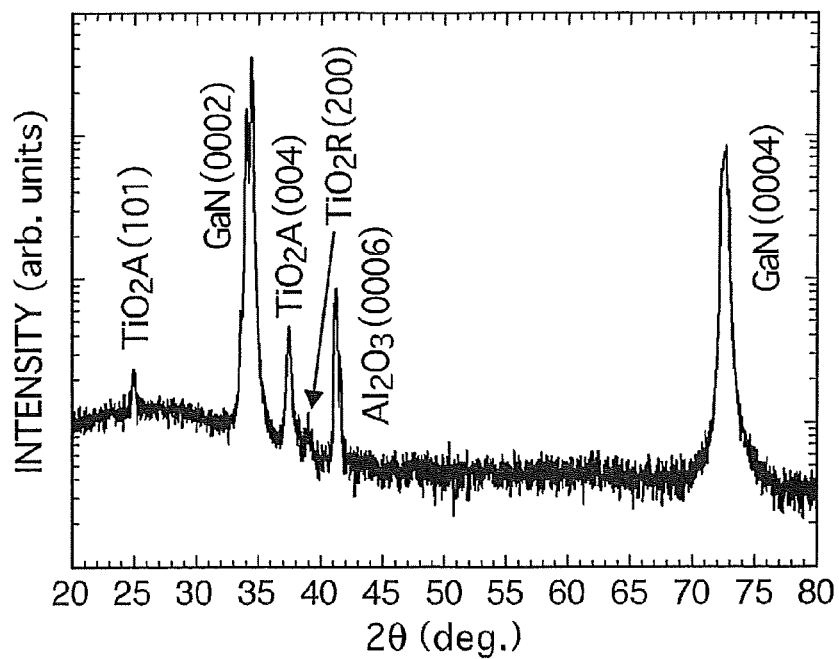
FIG. 8 is an X-ray diffraction graph showing crystallinity of a transparent conductive film in accordance with example 15.

As a result of examinations on the crystallinity of the transparent conductive film by X-ray diffraction measurements, it was confirmed that as shown in FIG. 8, the film was a crystalline film made of an anatase phase and an extremely small amount of a rutile phase, and that the respective phases were grown respectively with an epitaxial orientation relationship of twelve-fold symmetry and an epitaxial orientation relationship of six-fold symmetry, relative to the gallium nitride layer. The oxide thin film composed of gallium, indium and oxygen was confirmed to be made of a crystalline material in the same manner as in example 9.

When the in-plane orientation was examined by 0 scanning, it was found that in the same manner as in example 9, based upon the diffraction of a (104) plane of the anatase phase, the anatase phase (peak represented by A-TiO$_2$\{104\}) on the gallium nitride layer was grown with an epitaxial orientation relationship of twelve-fold symmetry, and that the rutile phase (peak represented by R—TiO$_2$\{110\}) was grown with an epitaxial orientation relationship of six-fold symmetry. In this case, in comparison with that of the anatase phase, the diffraction peak intensity of the rutile phase was such a weak level as not to be compared with example 9. That is, actually, the anatase phase was confirmed to be a main phase, and it was confirmed that the anatase phase occupied almost all phases.

When the refractive index of the transparent conductive film mainly composed of titanium oxide containing niobium was measured by using a spectroscopic ellipsometer, the film had a refractive index of 2.5 at a wavelength of 460 nm.

Next, hole measurements were carried out on the laminate having a hetero structure. As a result, the specific resistivity was 3.0×10$^{-4}$ Ω·cm, and the carrier mobility at this time was 200 cm$^2$V$^{-1}$s$^{-1}$ or more so that it was clarified that the mobility of electrons serving as carriers was peculiarly high.

Since it was estimated that this peculiarly high carrier mobility was derived from the hetero structure, the bandwidth chart was examined by XPS measurements. As a result, it was found that the Fermi level was locally lowered in such a manner as to drop with a spike shape relative to the conductive band on the gallium nitride layer side just in the vicinity of the interface of an anatase-phase TiO2 thin film/(oxide thin film composed of gallium, indium and oxygen/) gallium nitride layer that are hetero-joined to each other, and it was specified that in this drop portion, a two-dimensional electron gas was accumulated to cause a phenomenon in which electrons move at high speeds. The peculiarly high carrier mobility was considered to be realized by this phenomenon.

Comparative Example 3

In the same processes as those of example 9 except that the film thickness of a gallium oxide thin film serving as a buffer layer was 0.05 nm, after carrying out an acid treatment on the surface of a GaN template to remove a natural oxide film therefrom, a buffer layer made of a gallium oxide thin film was formed thereon by a helicon-wave excitation plasma sputtering method and a transparent conductor thin film mainly composed of titanium oxide containing niobium was successively formed thereon; thus, a laminate film was formed.

As a result of examinations on the crystallinity of the transparent conductive film by X-ray diffraction measurements, it was confirmed that the film was a crystalline film made of a rutile phase, and that the phase was grown with an epitaxial orientation relationship of six-fold symmetry, relative to the gallium nitride layer.

Next, the specific resistivity of the laminate was measured, and a high value of $4.2 \times 10^{-4}$ Ω·cm was obtained. Moreover, the refractive index at a wavelength of 460 nm was 2.6. As a result of hole measurements, its carrier mobility was less than 200 $cm^2V^{-1}s^{-1}$, so that a phenomenon in which the mobility of electrons serving as carriers becomes peculiarly high was not observed.

The structures and various characteristics of the laminates (transparent conductive film layers) produced in examples 1 to 10 and examples 12 to 15, as well as in comparative examples 1 to 3, are collectively shown in Table 1.

amorphous gallium, indium, aluminum and oxygen, or an oxynitride film made of amorphous gallium oxynitride, it is clearly indicated that the same effects as those of the gallium oxide thin film of example 1 are obtained.

Even in the case when in example 6, a laminate film, made of a transparent conductive film mainly composed of titanium oxide containing an appropriate amount of tantalum in place of niobium, was formed, it is clearly indicated that the same effects as those of example 1 with added niobium are obtained.

On the other hand, in the case when in example 7, a crystalline gallium oxide thin film having a β-Ga2O3 structure derived from a thermal oxidization was formed on a GaN template as a buffer layer, the transparent conductive film mainly composed of titanium oxide containing niobium formed thereon was not only allowed to have an anatase phase, but also grown by epitaxial growth with twelve-fold symmetry. Therefore, this transparent conductive film had characteristics that were equivalent to or superior to those of example 1.

TABLE 1

| | | Buffer layer | | Transparent conductive film | | | | Crystallinity of transparent conductive film*2 |
|---|---|---|---|---|---|---|---|---|
| | Substrate | Kinds | Thickness (nm) | Added element | Added amount (at %) | Refractive index | Specific resistivity (Ω·cm) | Mobility Evaluation*1 | |
| Example 1 | Glass | Ga2O3 | 10 | Nb | 5.7 | 2.5 | $4.2 \times 10^{-4}$ | — | A |
| Example 2 | Glass | Ga—In—O | 10 | Nb | 5.7 | 2.5 | $4.5 \times 10^{-4}$ | — | A |
| Example 3 | Glass | Ga—In—Al—O | 10 | Nb | 5.7 | 2.5 | $5.4 \times 10^{-4}$ | — | A |
| Example 4 | Glass | Ga—O—N | 10 | Nb | 5.7 | 2.5 | $4.4 \times 10^{-4}$ | — | A |
| Example 5 | Glass | Ga2O3 | 10 | Nb | 9.3 | 2.5 | $5.3 \times 10^{-4}$ | — | A |
| Example 6 | Glass | Ga2O3 | 10 | Ta | 5 | 2.5 | $5.1 \times 10^{-4}$ | — | A |
| Example 7 | GaN | Ga2O3 | 2 | Nb | 5.7 | 2.5 | $3.9 \times 10^{-4}$ | x | A |
| Example 8 | GaN | Ga2O3 | 2 | Nb | 5.7 | 2.6 | $4.3 \times 10^{-4}$ | x | A(rich)-R |
| Example 9 | GaN | Ga2O3 | 0.6 | Nb | 5.7 | 2.6 | $3.6 \times 10^{-4}$ | ○ | A(rich)-R |
| Example 10 | GaN | Ga2O3 | 0.1 | Nb | 5.7 | 2.6 | $3.9 \times 10^{-4}$ | ○ | A(rich)-R |
| Comparative Example 1 | Glass | n/a | 0 | Nb | 5.7 | 2.6 | $2.1 \times 10^{-2}$ | — | R |
| Comparative Example 2 | GaN | n/a | 0 | Nb | 5.7 | 2.6 | $4.5 \times 10^{-2}$ | x | R |
| Example 12 | GaN | Ga2O3 | 0.3 | Nb | 5.7 | 2.6 | $3.7 \times 10^{-4}$ | ○ | A(rich)-R |
| Example 13 | GaN | Ga2O3 | 1 | Nb | 5.7 | 2.6 | $3.8 \times 10^{-4}$ | ○ | A(rich)-R |
| Example 14 | GaN | Ga2O3 | 2 | Nb | 5.7 | 2.6 | $4.2 \times 10^{-4}$ | x | A(rich)-R |
| Example 15 | GaN | Ga—In—O | 0.6 | Nb | 5.7 | 2.5 | $3.0 \times 10^{-4}$ | ○ | A(rich)-R |
| Comparative Example 3 | GaN | Ga2O3 | 0.05 | Nb | 5.7 | 2.6 | $4.2 \times 10^{-2}$ | x | R |

*1: "○": 200 $cm^2V^{-1}s^{-1}$ or more, "x": less than 200 $cm^2V^{-1}s^{-1}$
*2: Crystallinity "A": Anatase, "R": Rutile, "A(rich)-R": Anatase main phase With respect to the above examples, first, in example 1 and example 5, an amorphous gallium oxide thin film having a film thickness of 10 nm was once formed on a glass substrate by a sputtering method, and on this substrate, laminate films, made of transparent conductive films mainly composed of titanium oxide with a film thickness of 200 nm, containing niobium having different concentrations, were formed. As a result, it was found that these transparent conductive films were made of an anatase phase, exerted a low specific resistivity equivalent to that of an ITO film, and had a high refractive index equivalent to that of a gallium nitride film.

Moreover, even in the case when in examples 2 to 4, the buffer layer was formed by an oxide thin film made of amorphous gallium, indium and oxygen, an oxide thin film made of In comparative example 1, a transparent conductive film composed of titanium oxide containing niobium was film-formed under conditions of a gas pressure of 5 Pa of a sputtering gas composed of a mixed gas of argon and oxygen and an oxygen ratio of 0.02%, that is, a condition of 1.0×10-3 Pa, which was a high oxygen partial pressure for a helicon-wave excitation plasma sputtering method. In this case, since the film was directly formed on a glass substrate that was an amorphous material under a condition of a high oxygen partial pressure, a rutile phase was undesirably formed.

However, in example 8, even when the transparent conductive film was formed under the same conditions, two phases of an anatase phase and a rutile phase were formed, and the results of X-ray diffraction measurements showed that the anatase phase was predominant.

That is, in example 8, in the same manner as in example 7, by the effects of the crystalline gallium oxide thin film having a β-Ga2O3 structure derived from a thermal oxidization, the anatase phase was formed as a main phase, even under conditions where originally the rutile phase was generated, and it was also clearly indicated that the phase was grown with an epitaxial orientation relationship of twelve-fold symmetry.

In examples 9, 10, 12 and 13, it is indicated that even in the case when a crystalline gallium oxide thin film formed by a sputtering method was used as a buffer layer, the transparent conductive film mainly composed of titanium oxide containing niobium was composed of an anatase phase as its main phase, with the anatase phase on the gallium nitride layer being grown with an epitaxial orientation relationship of twelve-fold symmetry, in the same manner as in example 7 where the film formation was carried out by a thermal oxidization.

Moreover, in the case when, as shown in examples 9, 10, 12 and 13, the film thickness of a crystalline gallium oxide thin film formed by a sputtering method was in a range from 0.1 to 1 nm, in the bandwidth chart of these laminates having a hetero structure, the Fermi level is locally lowered in such a manner as to drop with a spike shape relative to the conductive band on the gallium nitride layer side just in the vicinity of the interface of an anatase-phase TiO2 thin film/(gallium oxide thin film/) gallium nitride layer that are hetero-joined to each other. Thus, it was specified that a two-dimensional electron gas is accumulated in such a drop portion to cause a phenomenon in which electrons move at high speeds.

By this phenomenon, a peculiarly high carrier mobility is realized, with the result that, as shown in example 9, a low specific resistivity at room temperature of $3.6 \times 10^{-4}$ Ω·cm and a carrier mobility of 260 cm2V-1s-1 are exerted; thus, the mobility of electrons serving as carriers had a value of 200 cm2V-1s-1 or more, which was a peculiarly high value.

In example 14, different from examples 9, 10, 12 and 13, the crystalline gallium oxide thin film formed by a sputtering method had a buffer layer with a thickness of 2 nm that is thicker out of a range of 0.1 to 1 nm. In this case, although the transparent conductive film mainly composed of titanium oxide containing niobium was mainly composed of an anatase phase, with the anatase phase on the gallium nitride layer being grown with an epitaxial orientation relationship of twelve-fold symmetry, no phenomenon in which electrons move at high speeds was observed. The reason for this was concluded that since the thickness of the buffer layer was so thick that the band width chart of the laminate having a hetero-junction was made different. However, it was confirmed that the film exerted a sufficiently low specific resistivity next to the level of examples 9, 10, 12 and 13.

Moreover, in example 15, in the case when in place of the gallium oxide thin film, an oxide thin film composed of gallium, indium and oxygen was used, it was clarified that the resulting transparent conductive film had its almost all phase formed into an anatase phase. The epitaxial orientation relationship of the anatase phase relative to the gallium nitride layer was a twelve-fold symmetry in the same manner as in example 9, and the phenomenon in which electrons move at high speeds was also confirmed.

On the other hand, in the case of comparative example 2 in which a transparent conductive film, mainly composed of titanium oxide containing niobium, was directly formed on a gallium nitride film without forming a buffer layer, it was confirmed that its rutile phase was grown with an epitaxial orientation relationship of six-fold symmetry in the same manner as in Japanese Patent Application National Republication (Laid-Open) No. 2006-073189 and Japanese Patent Application Laid-Open No. 2008-50677.

In comparative example 3, different from examples 9, 10, 12 and 13, the crystalline gallium oxide thin film formed by a sputtering method had a buffer layer with a thickness of 0.05 nm that was extremely thin out of a range of 0.1 to 1 nm. In this case, it was confirmed that the transparent conductive film mainly composed of titanium oxide containing niobium was mainly composed of a rutile phase, with the rutile phase on the gallium nitride layer being grown with an epitaxial orientation relationship of six-fold symmetry.

From example 11 in which semiconductor light emitting elements were formed, it was clearly indicated that the semiconductor light emitting element to which the laminate film of the present invention composed of a gallium oxide thin film formed by a thermal oxidation process, serving as a buffer layer, and a transparent conductive film mainly composed of titanium oxide containing niobium was applied, was superior in light emitting efficiency for blue light in the vicinity of a wavelength of 460 nm, in comparison with the application of the conventional ITO film.

The invention claimed is:

1. A laminate comprising:
    a substrate;
    a buffer layer selected from the group consisting of a gallium oxide thin film, a gallium, indium oxide thin film, a gallium, indium, aluminum oxide thin film, a gallium oxynitride thin film, a gallium indium oxynitride thin film, and a gallium indium aluminum oxynitride thin film, formed on the substrate; and
    a transparent conductive film layer made of an oxide thin film, mainly composed of titanium oxide, containing at least one element selected from the group consisting of niobium, tantalum, molybdenum, arsenic, antimony and tungsten, and consisting of an anatase phase grown by epitaxial growth with twelve-fold symmetry formed on the buffer layer.

2. The laminate according to claim 1, wherein the buffer layer is an amorphous thin film.

3. The laminate according to claim 1, wherein the oxide thin film mainly composed of titanium oxide and contains niobium as the at least one element and has a niobium content represented by Nb/(Ti+Nb), with an atomic ratio in a range from 0.1 to 10% by atom.

4. The laminate according to claim 3, wherein the niobium content represented by Nb/(Ti+Nb) has an atomic ratio in a range from 2 to 6% by atom.

5. The laminate according to claim 1, wherein the oxide thin film mainly composed of titanium oxide contains tantalum as the at least one element and has a tantalum content represented by Ta/(Ti+Ta), with an atomic ratio in a range from 0.1 to 10% by atom.

6. The laminate according to claim 5, wherein the tantalum content represented by Ta/(Ti+Ta) has an atomic ratio in a range from 3 to 7% by atom.

7. The laminate of claim 1, wherein:
    the substrate carries a laminated film having an outermost surface layer that is a gallium nitride-based semiconductor layer.

8. The laminate according to claim 1, wherein the buffer layer has a crystalline structure.

9. The laminate according to claim 8, wherein the buffer layer has a monoclinic-type β-Ga$_2$O$_3$ structure.

10. The laminate according to claim 1, wherein the buffer layer has a thickness in a range from 0.1 to 50 nm.

11. The laminate according to claim 1, wherein the buffer layer has a thickness in a range from 0.1 to 1 nm.

12. A functional element comprising the laminate according to claim 1.

13. The laminate according to claim 7, wherein the gallium nitride-based semiconductor layer is an $(Al_{1-x-y-z}In_xGa_yB_z)N$ ($0 \leq x \leq 1$, $0 \leq y \leq 1$, $0 \leq z \leq 1$) layer.

14. The laminate according to claim 7, wherein the gallium nitride-based semiconductor layer is a thin film layer selected from the group consisting of a gallium nitride layer, a gallium indium nitride layer and a gallium indium aluminum nitride layer.

15. A laminate comprising:
- a substrate;
- a buffer layer selected from the group consisting of a gallium oxide thin film, gallium indium oxide thin film, a gallium indium aluminum oxide thin film, a gallium oxynitride thin film, a gallium indium oxynitride thin film, and a gallium indium aluminum oxynitride thin film, directly on the substrate; and
- a transparent conductive film layer mainly composed of titanium oxide, containing at least one element selected from the group consisting of niobium, tantalum, molybdenum, arsenic, antimony and tungsten, and comprising an anatase phase grown by epitaxial growth with twelve-fold symmetry directly on the buffer layer.

16. The laminate according to claim 15, wherein the buffer layer is an amorphous thin film.

17. The laminate according to claim 15, wherein the film layer mainly composed of titanium oxide contains niobium as the at least one element and has a niobium content represented by Nb/(Ti+Nb), with an atomic ratio in a range from 0.1 to 10% by atom.

18. The laminate according to claim 17, wherein the niobium content represented by Nb/(Ti+Nb) has an atomic ratio in a range from 2 to 6% by atom.

19. The laminate according to claim 15, wherein the film layer mainly composed of titanium oxide contains tantalum as the at least one element and has a tantalum content represented by Ta/(Ti+Ta), with an atomic ratio in a range from 0.1 to 10% by atom.

20. The laminate according to claim 19, wherein the tantalum content represented by Ta/(Ti+Ta) has an atomic ratio in a range from 3 to 7% by atom.

21. The laminate of claim 15, wherein:
- the substrate carries a laminated film having an outermost surface layer that is a gallium nitride-based semiconductor layer.

22. The laminate according to claim 21, wherein the gallium nitride-based semiconductor layer is a thin film layer selected from the group consisting of a gallium nitride layer, a gallium indium nitride layer and a gallium indium aluminum nitride layer.

23. The laminate according to claim 21, wherein the gallium nitride-based semiconductor layer is an $(Al_{1-x-y-z}In_xGa_yB_z)N$ ($0 \leq x \leq 1$, $0 \leq y \leq 1$, $0 \leq z \leq 1$) layer.

24. The laminate according to claim 15, wherein the buffer layer has a crystalline structure.

25. The laminate according to claim 24, wherein the buffer layer has a monoclinic-type $\beta\text{-}Ga_2O_3$ structure.

26. The laminate according to claim 15, wherein the buffer layer has a thickness in a range from 0.1 to 50 nm.

27. The laminate according to claim 15, wherein the buffer layer has a thickness in a range from 0.1 to 1 nm.

28. A functional element comprising the laminate according to claim 15.

* * * * *